United States Patent
Lin

(10) Patent No.: US 11,742,382 B2
(45) Date of Patent: Aug. 29, 2023

(54) METHOD FOR PREPARING SEMICONDUCTOR DEVICE WITH AIR GAP AND BORON NITRIDE CAP

(71) Applicant: NANYA TECHNOLOGY CORPORATION, New Taipei (TW)

(72) Inventor: Yuan-Yuan Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 17 days.

(21) Appl. No.: 17/537,911

(22) Filed: Nov. 30, 2021

(65) Prior Publication Data

US 2022/0093732 A1     Mar. 24, 2022

Related U.S. Application Data

(62) Division of application No. 16/937,347, filed on Jul. 23, 2020, now Pat. No. 11,380,758.

(51) Int. Cl.
*H01L 29/06* (2006.01)
*H10B 12/00* (2023.01)

(52) U.S. Cl.
CPC ..... *H01L 29/0649* (2013.01); *H10B 12/0335* (2023.02); *H10B 12/05* (2023.02); *H10B 12/31* (2023.02)

(58) Field of Classification Search
CPC ........... H01L 29/0649; H01L 21/76825; H01L 21/7682; H01L 21/764; H01L 2221/1063; H10B 12/0335; H10B 12/05; H10B 12/31; H10B 12/09; H10B 12/30; H10B 12/02; H10B 12/48; H10B 12/482; H10B 12/485

See application file for complete search history.

(56) References Cited

U.S. PATENT DOCUMENTS

| | | | |
|---|---|---|---|
| 2004/0224537 A1 | 11/2004 | Lee | |
| 2009/0263972 A1* | 10/2009 | Balseanu | H01L 21/31122 257/E21.249 |
| 2012/0007165 A1* | 1/2012 | Lee | H10B 41/40 257/E27.06 |
| 2012/0187566 A1* | 7/2012 | Horak | H01L 21/7682 438/622 |

(Continued)

OTHER PUBLICATIONS

Office Action dated Feb. 25, 2022 related to Taiwanese Application No. 110116273.

*Primary Examiner* — Dao H Nguyen
(74) *Attorney, Agent, or Firm* — Xuan Zhang

(57) ABSTRACT

The present disclosure provides a method for preparing a semiconductor device. The method includes forming a first metal plug, a second metal plug, a third metal plug, and a fourth metal plug over a semiconductor substrate. The method also includes depositing a boron nitride layer over the first metal plug, the second metal plug, the third metal plug, and the fourth metal plug. A first portion of the boron nitride layer extends between the first metal plug and the second metal plug such that the first portion of the boron nitride layer and the semiconductor substrate are separated by an airgap while a second portion of the boron nitride layer extends between the third metal plug and the fourth metal plug such that the second portion of the boron nitride layer is in direct contact with the semiconductor substrate.

7 Claims, 20 Drawing Sheets

(56) References Cited

U.S. PATENT DOCUMENTS

| | | | |
|---|---|---|---|
| 2013/0256761 A1* | 10/2013 | Sim | H01L 27/0207 |
| | | | 257/208 |
| 2016/0225658 A1 | 8/2016 | Han | |
| 2017/0125431 A1* | 5/2017 | Chen | H10B 41/35 |
| 2018/0233500 A1 | 8/2018 | Cheng | |
| 2019/0259831 A1 | 8/2019 | Ok et al. | |
| 2021/0335614 A1 | 10/2021 | Ho | |

\* cited by examiner

METHOD FOR PREPARING SEMICONDUCTOR DEVICE WITH AIR GAP AND BORON NITRIDE CAP

CROSS-REFERENCE TO RELATED APPLICATION

This application is a divisional application of U.S. Non-Provisional application Ser. No. 16/937,347 filed on Jul. 23, 2020, which is incorporated herein by reference in its entirety.

TECHNICAL FIELD

The present disclosure relates to a method for preparing a semiconductor device, and more particularly, to a method for preparing a semiconductor device with an air gap and a boron nitride cap for reducing capacitive coupling in a pattern-dense region.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for the integration of various types of semiconductor devices.

However, the manufacturing and integration of semiconductor devices involve many complicated steps and operations. Integration in semiconductor devices becomes increasingly complicated. An increase in the complexity of manufacturing and integration of the semiconductor device may cause deficiencies, such as increased parasitic capacitance between adjacent conductive elements, which results in increased power consumption and unwanted resistive-capacitive (RC) delay (i.e., signal delay), especially in a pattern-dense region. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first metal plug and a second metal plug disposed over a pattern-dense region of a semiconductor substrate. The semiconductor device also includes a third metal plug and a fourth metal plug disposed over a pattern-loose region of the semiconductor substrate. The semiconductor device further includes a boron nitride layer disposed over the pattern-dense region and the pattern-loose region of the semiconductor substrate. A first portion of the boron nitride layer between the first metal plug and the second metal plug is separated from the semiconductor substrate by an air gap, and a second portion of the boron nitride layer between the third metal plug and the fourth metal plug is in direct contact with the semiconductor substrate.

In an embodiment, the first metal plug is separated from the second metal plug by a first distance, the third metal plug is separated from the fourth metal plug by a second distance, and the second distance is greater than the first distance. In an embodiment, the first metal plug, the second metal plug, the third metal plug, and the fourth metal plug are covered by the boron nitride layer, and a top surface of the first metal plug is higher than a bottom surface of the first portion of the boron nitride layer. In an embodiment, the semiconductor device further includes a first spacer surrounding the first metal plug, and a second spacer surrounding the second metal plug, wherein the air gap is enclosed by the first spacer, the second spacer, the first portion of the boron nitride layer, and the semiconductor substrate. In an embodiment, the semiconductor device further includes a third spacer surrounding the third metal plug, wherein the third spacer is enclosed by the third metal plug, the boron nitride layer, and the semiconductor substrate, and a fourth spacer surrounding the fourth metal plug, wherein the fourth spacer is enclosed by the fourth metal plug, the boron nitride layer, and the semiconductor substrate. In an embodiment, the semiconductor device further includes an energy removable structure disposed between the first metal plug and the second metal plug, wherein a portion of the energy removable structure is between the air gap and the semiconductor substrate. In an embodiment, the pattern-dense region is in a memory cell of a memory device, and the pattern-loose region is in a peripheral region outside of the memory cell of the memory device.

In another embodiment of the present disclosure, a semiconductor device is provided. The semiconductor device includes a first metal plug and a second metal plug disposed over a pattern-dense region of a semiconductor substrate. The first metal plug and the second metal plug have an air gap therebetween. The semiconductor device also includes a third metal plug and a fourth metal plug disposed over a pattern-loose region of the semiconductor substrate. A distance between the first metal plug and the second metal plug is less than a distance between the third metal plug and the fourth metal plug. The semiconductor device further includes a boron nitride layer covering the first metal plug, the second metal plug, the third metal plug, and the fourth metal plug. The boron nitride layer has a first portion between the first metal plug and the second metal plug and a second portion between the third metal plug and the fourth metal plug, and a height of the second portion is greater than a height of the first portion.

In an embodiment, the height of the second portion is substantially the same as a height of the third metal plug. In an embodiment, a width of the second portion of the boron nitride layer is greater than a width of the first portion of the boron nitride layer. In an embodiment, the semiconductor device further includes a first spacer surrounding the first metal plug, a second spacer surrounding the second metal plug, a third spacer surrounding the third metal plug, and a fourth spacer surrounding the fourth metal plug, wherein the air gap is between the first spacer and the second spacer. In an embodiment, a contact area between the second portion of the boron nitride layer and the third spacer is greater than a contact area between the first portion of the boron nitride layer and the first spacer. In an embodiment, the semiconductor device further includes an energy removable structure disposed between the first spacer and the second spacer and covered by the first portion of the boron nitride layer, wherein the air gap is enclosed by the energy removable structure.

In yet another embodiment of the present disclosure, a method for preparing a semiconductor device is provided. The method includes forming a first metal plug, a second metal plug, a third metal plug, and a fourth metal plug over a semiconductor substrate, wherein the first metal plug and the second metal plug are over a pattern-dense region of the semiconductor substrate, and the third metal plug and the fourth metal plug are over a pattern-loose region of the semiconductor substrate. The method also includes depositing a boron nitride layer over the first metal plug, the second metal plug, the third metal plug, and the fourth metal plug. A first portion of the boron nitride layer extends between the first metal plug and the second metal plug such that the first portion of the boron nitride layer and the semiconductor substrate are separated by an air gap while a second portion of the boron nitride layer extends between the third metal plug and the fourth metal plug such that the second portion of the boron nitride layer is in direct contact with the semiconductor substrate.

In an embodiment, the bottommost width of the second portion of the boron nitride layer is greater than the bottommost width of the first portion of the boron nitride layer. In an embodiment, the method further includes forming a first spacer surrounding the first metal plug, a second spacer surrounding the second metal plug, a third spacer surrounding the third metal plug, and a fourth spacer surrounding the fourth metal plug before the boron nitride layer is deposited. In an embodiment, the method further includes a step of before the boron nitride layer is deposited, performing a deposition process that selectively deposits an energy removable layer between the first spacer and the second spacer in the pattern-dense region without depositing the energy removable layer between the third spacer and the fourth spacer in the pattern-loose region. In an embodiment, the boron nitride layer is formed to cover the energy removable layer, and the method further includes a step of performing a heat treatment process to remove the energy removable layer, such that the air gap is enclosed by the first spacer, the second spacer, the first portion of the boron nitride layer, and the semiconductor substrate. In an embodiment, the boron nitride layer is formed to cover the energy removable layer, and the method also further includes a step of performing a heat treatment process to transform the energy removable layer into an energy removable structure, wherein the air gap is enclosed by the energy removable structure, and the energy removable structure is denser than the energy removable layer. In an embodiment, the formation of the first metal plug, the second metal plug, the third metal plug, and the fourth metal plug includes the steps of forming a doped oxide layer over the semiconductor substrate, etching the doped oxide layer to form a plurality of openings exposing the semiconductor substrate, forming the first metal plug, the second metal plug, the third metal plug, and the fourth metal plug in the openings, and removing the doped oxide layer before the boron nitride layer is deposited.

Embodiments of a semiconductor device are provided in the disclosure. The semiconductor device includes metal plugs and a boron nitride layer over a pattern-dense region and a pattern-loose region of a semiconductor substrate. The boron nitride layer has a first portion between the metal plugs in the pattern-dense region, and a second portion between the metal plugs in the pattern-loose region. The first portion of the boron nitride layer is separated from the semiconductor substrate by an air gap, and the second portion of the boron nitride layer is in direct contact with the semiconductor substrate. Therefore, the parasitic capacitance between the metal plugs of the pattern-dense region may be reduced. As a result, the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
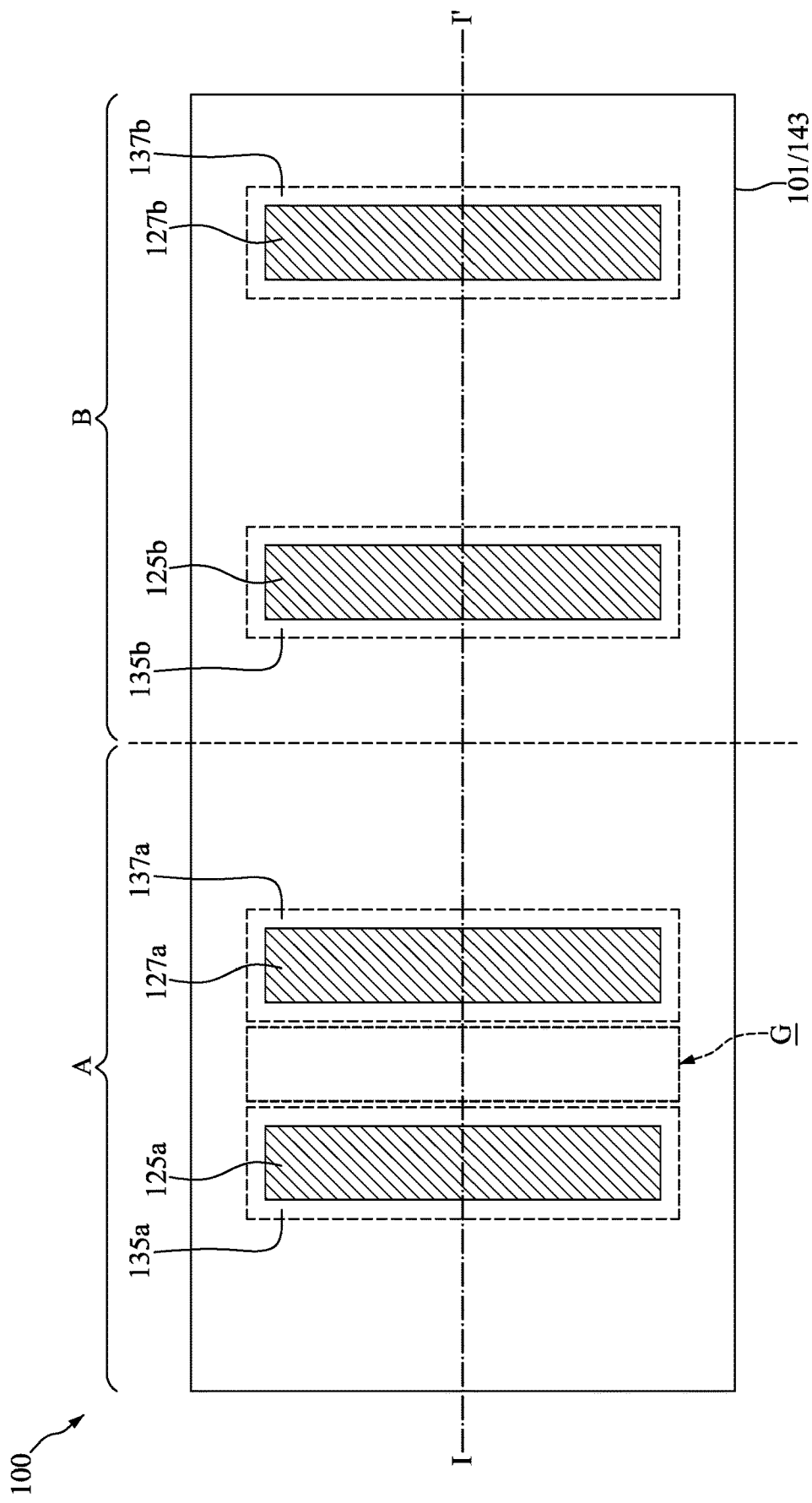
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
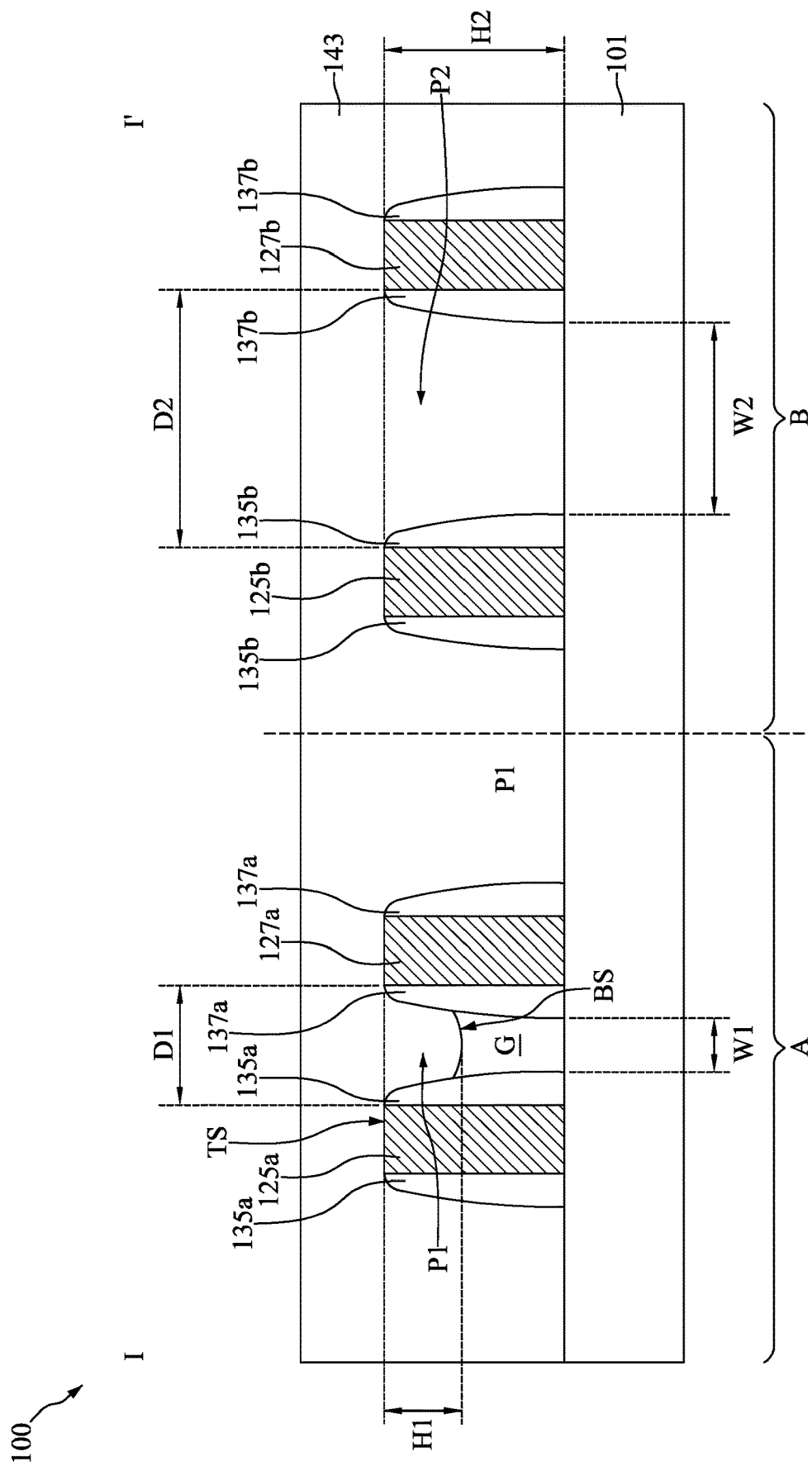
FIG. 2 is a cross-sectional view illustrating the semiconductor device along the sectional line I-I' in FIG. 1, in accordance with some embodiments.

FIG. 1 is a top view illustrating a semiconductor device 100, and FIG. 2 is a cross-sectional view illustrating the semiconductor device 100 along the sectional line I-I' in FIG. 1, in accordance with some embodiments. In some embodiments, the semiconductor device 100 includes a semiconductor substrate 101, conductive features 125a, 125b, 127a, 127b, spacers 135a, 135b, 137a, 137b, and a dielectric layer such as a boron nitride (BN) layer 143, as shown in FIGS. 1 and 2 in accordance with some embodiments. In some embodiments, the conductive features 125a, 125b, 127a, 127b are conductive wires such as interconnects or bit lines, configured to electrically connecting two conductive terminals laterally separated from each other. In some embodiments, the conductive features 125a, 125b, 127a, 127b are metal plugs, such as bit line plug or capacitor plug, configured to electrically connecting two conductive terminals vertically separated from each other. The conductive features 125a, 125b, 127a, 127b are elaborated in connection with following figures, using the metal plugs as examples.

In some embodiments, isolation structures (not shown) are disposed in the semiconductor substrate 101, and active areas (not shown) are defined by the isolation structures in the semiconductor substrate 101. Each of the active areas may include source/drain (S/D) regions. In some embodiments, the semiconductor substrate 101 has a pattern-dense region A and a pattern-loose region B, the metal plugs 125a and 127a are disposed over the pattern-dense region A, and the metal plugs 125b and 127b are disposed over the pattern-loose region B. It should be noted that the distance D1 between the metal plugs 125a and 127a is less than the distance D2 between the metal plugs 125b and 127b. No obvious interfaces exist between the pattern-dense region A and the pattern-loose region B. The dashed lines shown in FIGS. 1 and 2 are used to clarify the disclosure.

The spacers 135a and 137a are disposed over the pattern-dense region A, and the spacers 135b and 137b are disposed over the pattern-loose region B. In some embodiments, the metal plug 125a is surrounded by the spacer 135a, the metal plug 127a is surrounded by the spacer 137a, the metal plug 125b is surrounded by the spacer 135b, and the metal plug 127b is surrounded by the spacer 137b. The dielectric layer (boron nitride layer) 143 is disposed over the pattern-dense region A and the pattern-loose region B.

Specifically, the metal plugs 125a, 125b, 127a, 127b and the spacers 135a, 135b, 137a, 137b over the pattern-dense region A and the pattern-loose region B are covered by the boron nitride layer 143. In some embodiments, the boron nitride layer 143 has a first portion P1 between the metal plugs 125a and 127a, and a second portion P2 between the metal plugs 125b and 127b. In other words, the first portion P1 of the boron nitride layer 143 is over the pattern-dense region A of the semiconductor substrate 101, and the second portion P2 of the boron nitride layer 143 is over the pattern-loose region B of the semiconductor substrate 101. In particular, the first portion P1 of the boron nitride layer 143 is between and in direct contact with the spacers 135a and 137a, and the second portion P2 of the boron nitride layer 143 is between and in direct contact with the spacers 135b and 137b. In some embodiments, the contact area between the first portion P1 of the boron nitride layer 143 and the spacer 135a (or the spacer 137a) is less than the contact area between the second portion P2 of the boron nitride layer 143 and the spacer 135b (or the spacer 137b).

It should be noted that the first portion P1 of the boron nitride layer 143 is separated from the semiconductor substrate 101 by an air gap G while the second portion P2 of the boron nitride layer 143 is in direct contact with the semiconductor substrate 101. In other words, there is no air gap in the pattern-loose region B. As shown in FIG. 2, the second portion P2 of the boron nitride layer 143 extends to cover the bottommost parts of the spacers 135b and 137b, such that the spacer 135b is enclosed by the metal plug 125b, the second portion P2 of the boron nitride layer 143, and the semiconductor substrate 101, and the spacer 137b is enclosed by the metal plug 127b, the second portion P2 of the boron nitride layer 143, and the semiconductor substrate 101. In some embodiments, the air gap G is between the spacers 135a and 137a of the pattern-dense region A, and a top surface TS of the metal plug 125a is higher than a bottom surface BS of the first portion P1 of the boron nitride layer 143 (i.e., the interface between the first portion P1 of the boron nitride layer 143 and the air gap (G).

In some embodiments, the first portion P1 of the boron nitride layer 143 has a width W1, the second portion P2 of the boron nitride layer 143 has a width W2, and the width W2 is greater than the width W1. Moreover, the first portion P1 of the boron nitride layer 143 has a height H1, the second portion P2 of the boron nitride layer 143 has a height H2, and the height H2 is greater than the height H1. It should be noted that the height H2 of the second portion P2 of the boron nitride layer 143 is substantially the same as the height of the metal plug 125b or the height of the metal plug 127b. Within the context of this disclosure, the word "substantially" means preferably at least 90%, more preferably 95%, even more preferably 98%, and most preferably 99%.

Furthermore, bit lines (not shown) and storage nodes (not shown) may be formed over the structure of FIGS. 1 and 2 in the subsequent processes. In some embodiments, the bit lines and the storage nodes are electrically connected to the S/D regions in the semiconductor substrate 101. In some embodiments, the semiconductor device 100 is a dynamic random access memory (DRAM).

Figure 3:
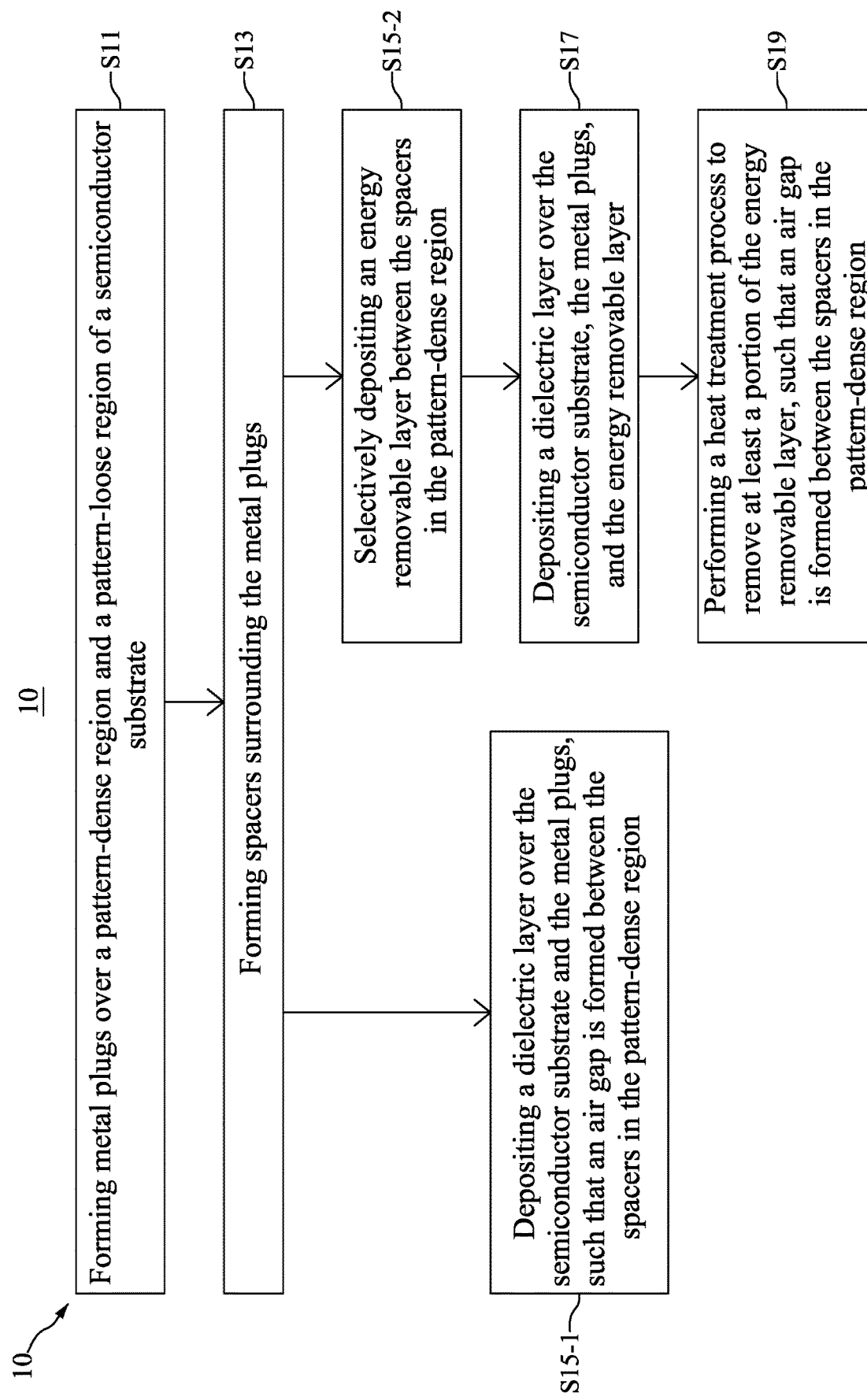
FIG. 3 is a flow diagram illustrating a method of forming a semiconductor device, in accordance with some embodiments.
Figure 4:
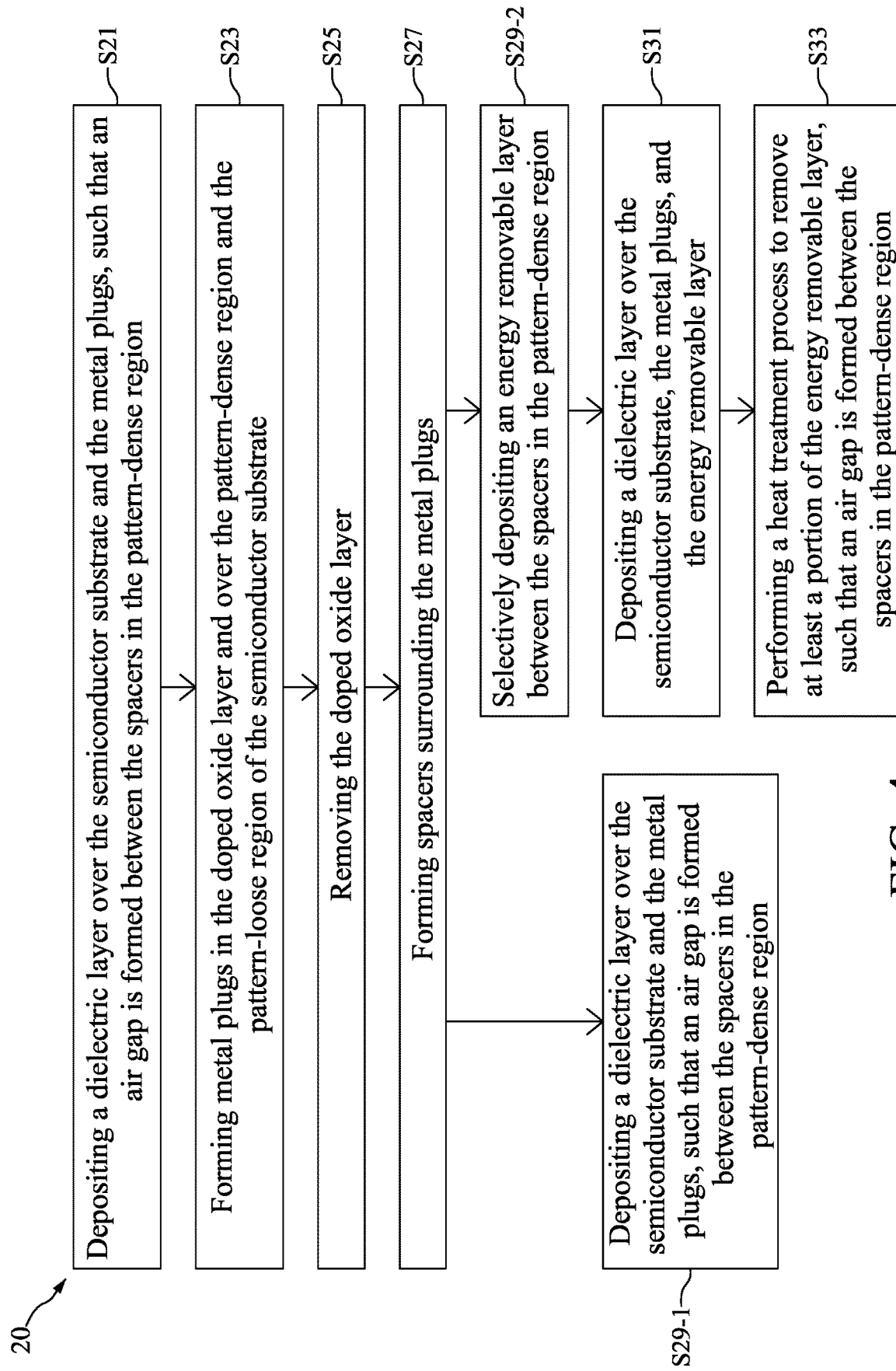
FIG. 4 is a flow diagram illustrating a method of forming a semiconductor device, in accordance with some other embodiments.

FIG. 3 is a flow diagram illustrating a method 10 of forming the semiconductor device 100, and the method 10 includes steps S11, S13, S15-1, S15-2, S15-3, S17, and S19, in accordance with some embodiments. FIG. 4 is a flow diagram illustrating another method 20 of forming the semiconductor device 100, and the method 20 includes steps S21, S23, S25, S27, S29-1, S29-2, S29-3, S31, and S33, in accordance with some embodiments. The steps S11 to S19 of FIG. 3 and the steps S21 to S33 of FIG. 4 are elaborated in connection with following figures.

Figure 5:
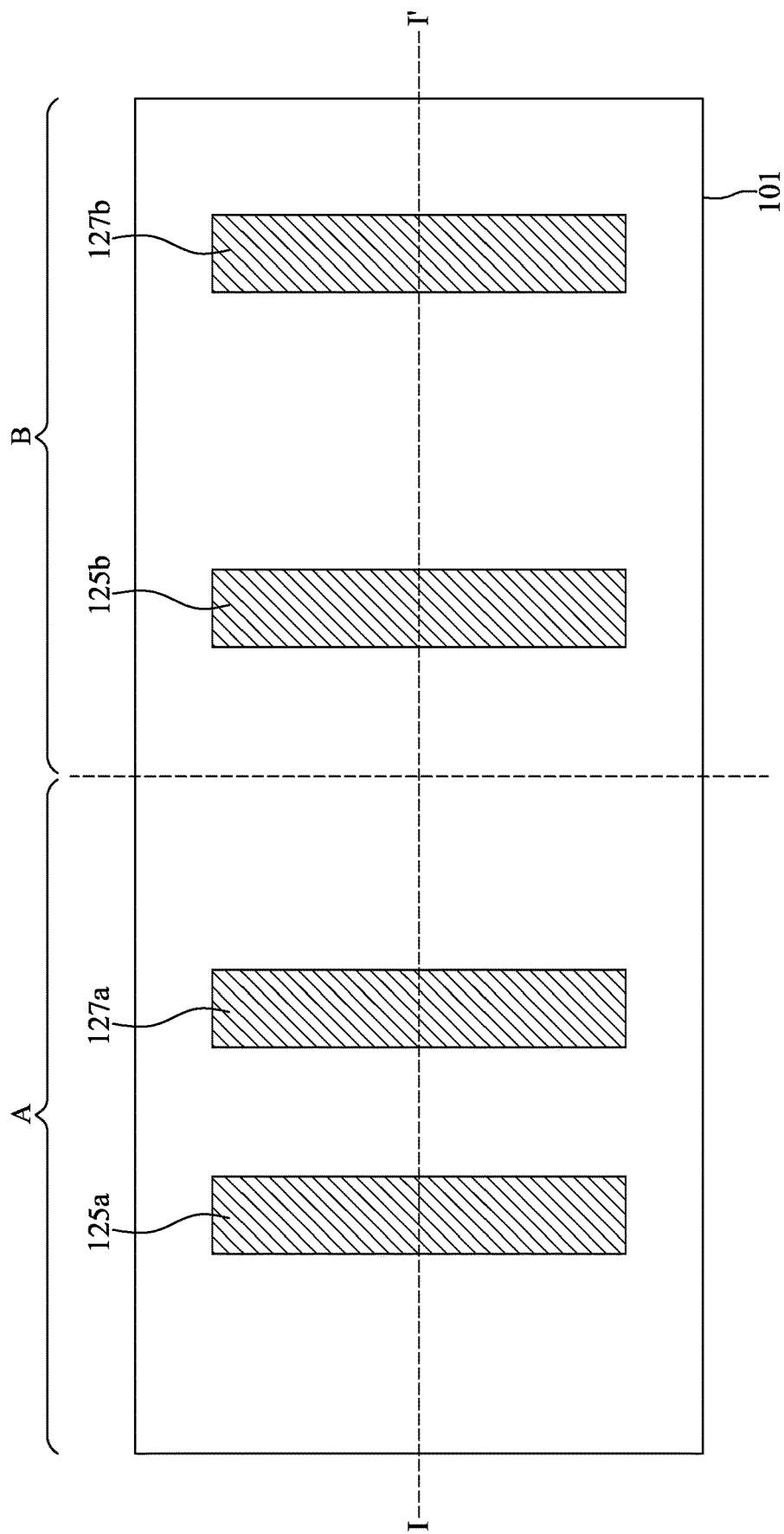
FIG. 5 is a top view illustrating an intermediate stage of forming metal plugs during the formation of the semiconductor device, in accordance with some embodiments.
Figure 6:
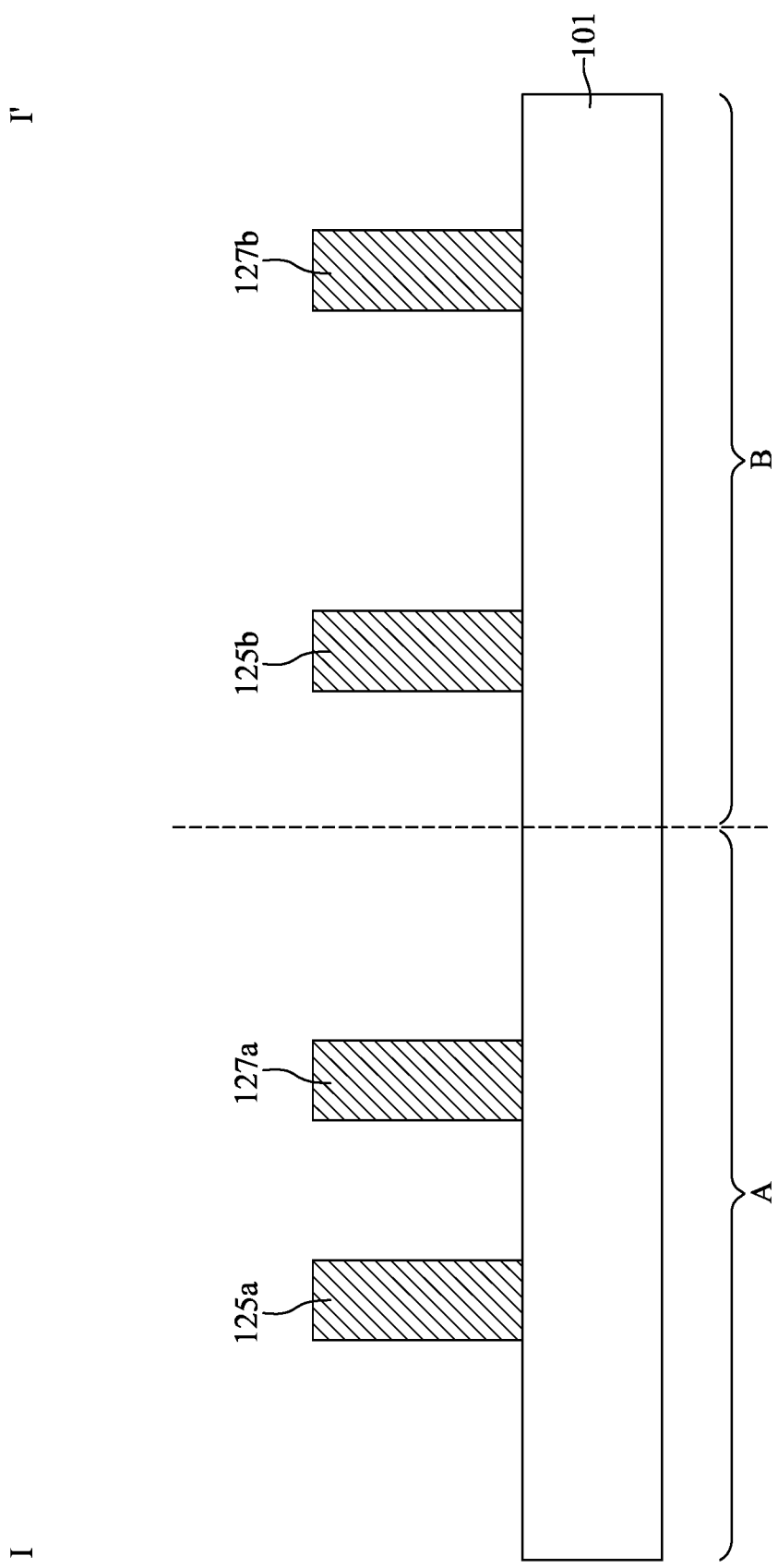
FIG. 6 is a cross-sectional view illustrating an intermediate stage of forming metal plugs during the formation of the semiconductor device along the sectional line I-I' in FIG. 5, in accordance with some embodiments.
Figure 7:
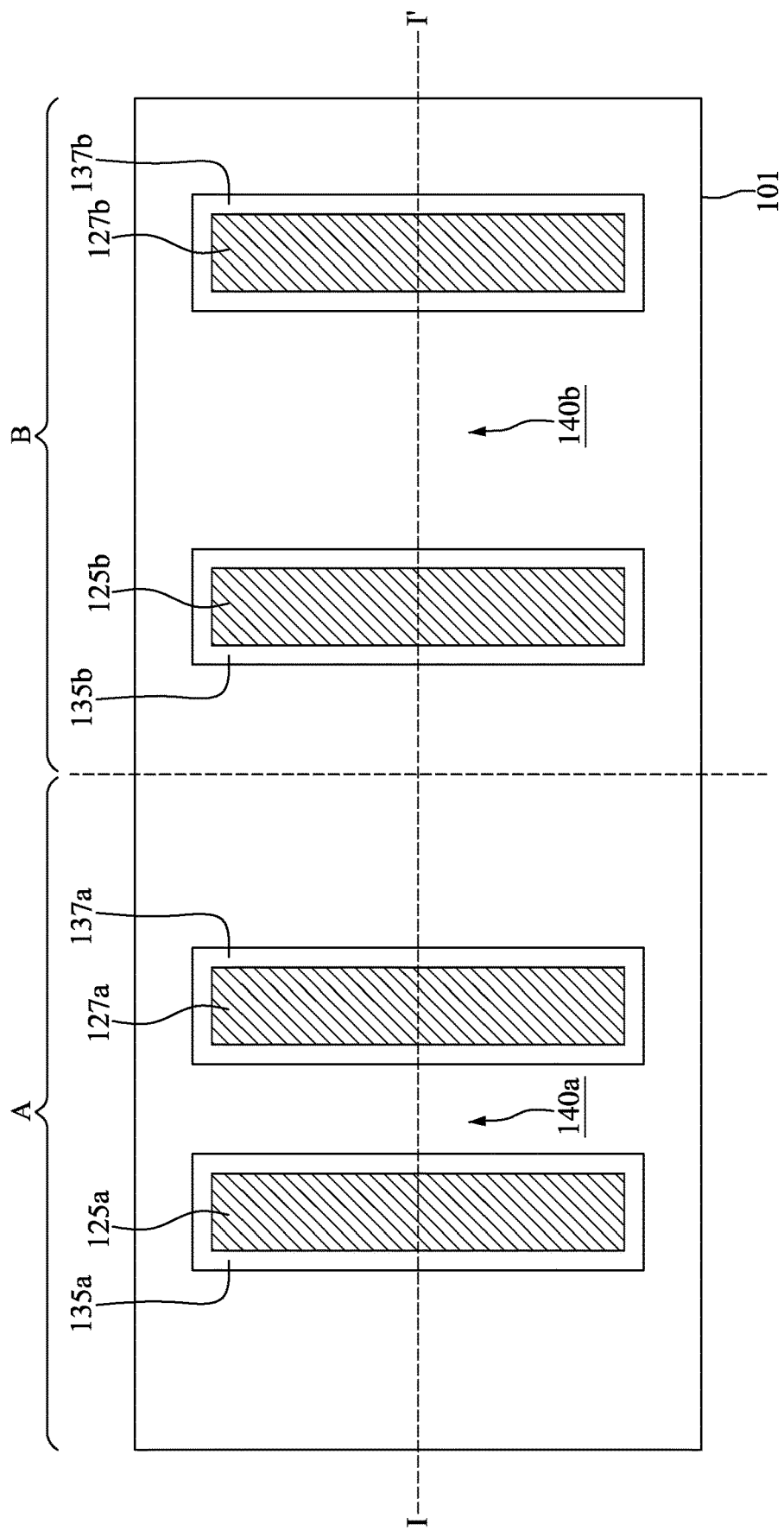
FIG. 7 is a top view illustrating an intermediate stage of forming spacers during the formation of the semiconductor device, in accordance with some embodiments.
Figure 8:
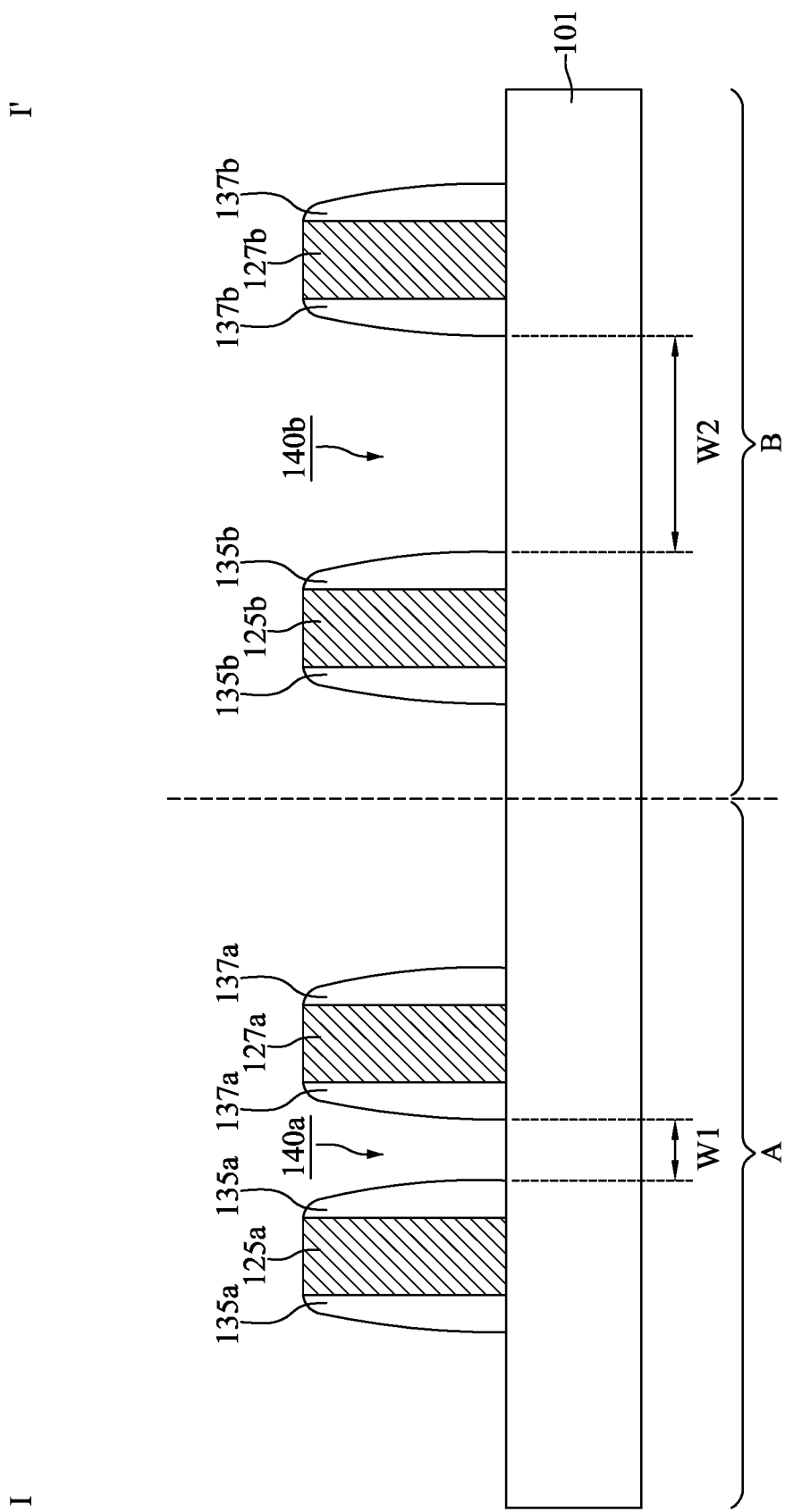
FIG. 8 is a cross-sectional view illustrating an intermediate stage of forming spacers during the formation of the semiconductor device along the sectional line I-I' in FIG. 7, in accordance with some embodiments.

FIGS. 5 and 7 are top views illustrating intermediate stages in the formation of the semiconductor device 100, and FIGS. 6 and 8 are cross-sectional views illustrating intermediate stages in the formation of the semiconductor device 100, in accordance with some embodiments. It should be noted that FIGS. 6 and 8 are cross-sectional views along the sectional line I-I' of FIGS. 5 and 7, respectively.

As shown in FIGS. 5 and 6, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

As mentioned above, the semiconductor substrate 101 has a pattern-dense region A and a pattern-loose region B, and isolation structures and S/D regions may be formed in the semiconductor substrate 101. In these cases, the metal plugs 125a, 125b, 127a, and 127b are formed over the S/D regions. In some embodiments, the metal plugs 125a and 127a are formed over the pattern-dense region A, and the metal plugs 125b and 127b are formed over the pattern-loose region B. The respective step is illustrated as the step S11 in the method 10 shown in FIG. 3. It should be noted that the number of metal plugs over the pattern-dense region A is not limited to two, and may be more than two. Similarly, the number of metal plugs over the pattern-loose region B is not limited to two, and may be more than two, either.

In some embodiments, the metal plugs 125a, 125b, 127a, and 127b are made of copper (Cu), copper alloy, aluminum (Al), aluminum alloy, tungsten (W), tungsten alloy, titanium (Ti), titanium alloy, tantalum (Ta), tantalum alloy, another applicable conductive material, or a combination thereof. In some embodiments, the metal plugs 125a, 125b, 127a, and 127b are formed by electroplating. In some other embodiments, the metal plugs 125a, 125b, 127a, and 127b are formed by a chemical vapor deposition (CVD) process, a metal organic CVD (MOCVD) process, a physical vapor deposition (PVD) process, an atomic layer deposition (ALD) process, a sputtering process, or another applicable process.

Next, as shown in FIGS. 7 and 8, the spacers 135a, 135b, 137a, and 137b are formed surrounding the metal plugs 125a, 125b, 127a, and 127b, in accordance with some embodiments. The respective step is illustrated as the step S13 in the method 10 shown in FIG. 3. In some embodiments, the spacers 135a, 135b, 137a, and 137b are formed on sidewalls of the metal plugs 125a, 125b, 127a, and 127b, respectively.

In some embodiments, the spacers 135a, 135b, 137a, and 137b are made of silicon oxide, silicon carbide, silicon nitride, silicon oxynitride, another applicable dielectric material, or a combination thereof. In some embodiments, the formation of the spacers 135a, 135b, 137a, and 137b includes conformally depositing a spacer material (not shown) over the top surfaces and the sidewalls of the metal plugs 125a, 125b, 127a, and 127b and the top surface of the semiconductor substrate 101, and etching the spacer material to form the spacers 135a, 135b, 137a, and 137b on sidewalls of the metal plugs 125a, 125b, 127a, and 127b.

The deposition process for forming the spacers 135a, 135b, 137a, and 137b may include a CVD process, a PVD process, an ALD process, a spin-coating process, or another applicable process. In addition, the etching process for forming the spacers 135a, 135b, 137a, and 137b may be an anisotropic etching process, which removes the same amount of the spacer material vertically in all places, leaving the spacers 135a, 135b, 137a, and 137b on the sidewalls of the metal plugs 125a, 125b, 127a, and 127b. In some embodiments, the etching process is a dry etching process. As a result, an opening 140a is obtained between the spacers 135a and 137a, and another opening 140b is obtained between the spacers 135b and 137b.

Referring to FIG. 2, after the spacers 135a, 135b, 137a, and 137b are formed, the boron nitride layer 143 is deposited over the structure of FIGS. 7 and 8, such that the air gap G is formed in the pattern-dense region A, in accordance with some embodiments. The respective step is illustrated as the step S15-1 in the method 10 shown in FIG. 3. In some embodiments, the boron nitride layer 143 has a hexagonal textured structure In some embodiments, the boron nitride layer 143 is formed, using ALD and/or PEALD techniques. In this exemplary embodiment, the device is placed in a reaction chamber and is preferably heated to a temperature between 100 degrees Celsius and 500 degrees Celsius at a chamber pressure between 0.5 Torr and 10 Torr. More preferably, the temperature is between 300 degrees Celsius and 400 degrees Celsius, and the chamber pressure is between 0.5 Torr and 3 Torr.

In some embodiments, a boron precursor gas, such as one or more of boron trichloride ($BCl_3$), trimethylboron (B $(CH_3)_3$), diborane ($B_2H_6$), boron tribromide ($BBr_3$), or a precursor gas diluted with an inert gas such as helium (He) or argon (Ar), is then pulsed into the chamber where it is allowed to form a monolayer, or less than a monolayer, on the exposed surfaces of the device (i.e., surfaces of the gate stack, hardmask, semiconductor body, and, if present, the liner layer). In some embodiments, the boron precursor is pulsed for a time period between 2 seconds to 30 seconds at a flow rate ranging from 50 standard cubic centimeters (sccm) per minute to 1,000 sccm per minute. In some embodiments, the flow rate at which the boron precursor is pulsed into the chamber is between 100 sccm per minute and 500 sccm per minute.

In some embodiments, after the boron precursor is pulsed into the chamber, the chamber is purged with an inert gas, such as nitrogen ($N_2$), argon (Ar), or helium (He), for an amount of time (e.g., 30 seconds) necessary to remove byproducts andallunreacted species from the chamber.

In some embodiments, a nitrogen-containing reactant gas, such as nitrogen, ammonia ($_{NH3}$), or a mixture of nitrogen and hydrogen ($H_2$), is then pulsed into the deposition chamber to react with the first layer and form a monolayer of boron-nitrogen. In some embodiments, the nitrogen-containing gas is pulsed into the chamber for a time period between 1 second and 10 seconds at a flow rate between 50 sccm per minute and 1,000 sccm per minute. In some embodiments, the flow rate at which the nitrogen-containing gas is pulsed is between 100 sccm per minute and 300 sccm per minute.

In some embodiments, PEALD techniques may also be used when providing the nitrogen-containing reactant gas to the chamber, whereby the boron-nitrogen bond forming reactions are assisted by dissociating the reactant gases using a plasma. In some embodiments, where PEALD is used, the plasma condition is created at a power between 50 W to 500 W and, more preferably, at a power between 100 W and 200 W.

In some embodiments, after pulsing the nitrogen-containing reactant gas, the chamber is again purged for an appropriate amount of time, and the cycle is repeated until deposition of the boron nitride layer has occurred to the desired thickness.

Since the width W2 of the opening 140b is greater than the width W1 of the opening 140a (see FIG. 8), the opening 140b is entirely filled by the boron nitride layer 143 while the opening 140a is only partially filled by the boron nitride layer 143 due to the loading effect. As a result, the air gap G is sealed by the first portion P1 of the boron nitride layer 143. In some embodiments, the air gap G is enclosed by the first portion P1 of the boron nitride layer 143, the spacers 135a, 137a, and the semiconductor substrate 101. In addition, the width W2 is also the width of the second portion P2 of the boron nitride layer 143 between the spacers 135b and 137b, and the width W1 is also the width W1 of the first portion P1 of the boron nitride layer 143 between the spacers 135a and 137a, as shown in FIG. 2 in accordance with some embodiments.

After the boron nitride layer 143 is deposited, the semiconductor device 100 is obtained. By forming the air gap G between the metal plugs 125a and 127a (or between the spacers 135a and 137a surrounding the metal plugs 125a and 127a), the parasitic capacitance between the metal plugs 125a and 127a may be reduced, especially in the pattern-dense region A. As a result, the overall device performance may be improved (e.g., the decreased power consumption and signal delay).

FIGS. 9 to 15 are cross-sectional views illustrating intermediate stages in the formation of the semiconductor device 100, in accordance with some embodiments. The forming method shown in FIGS. 9-15 is different from the forming method shown in FIGS. 1, 2, and 5 to 8.

Figure 9:
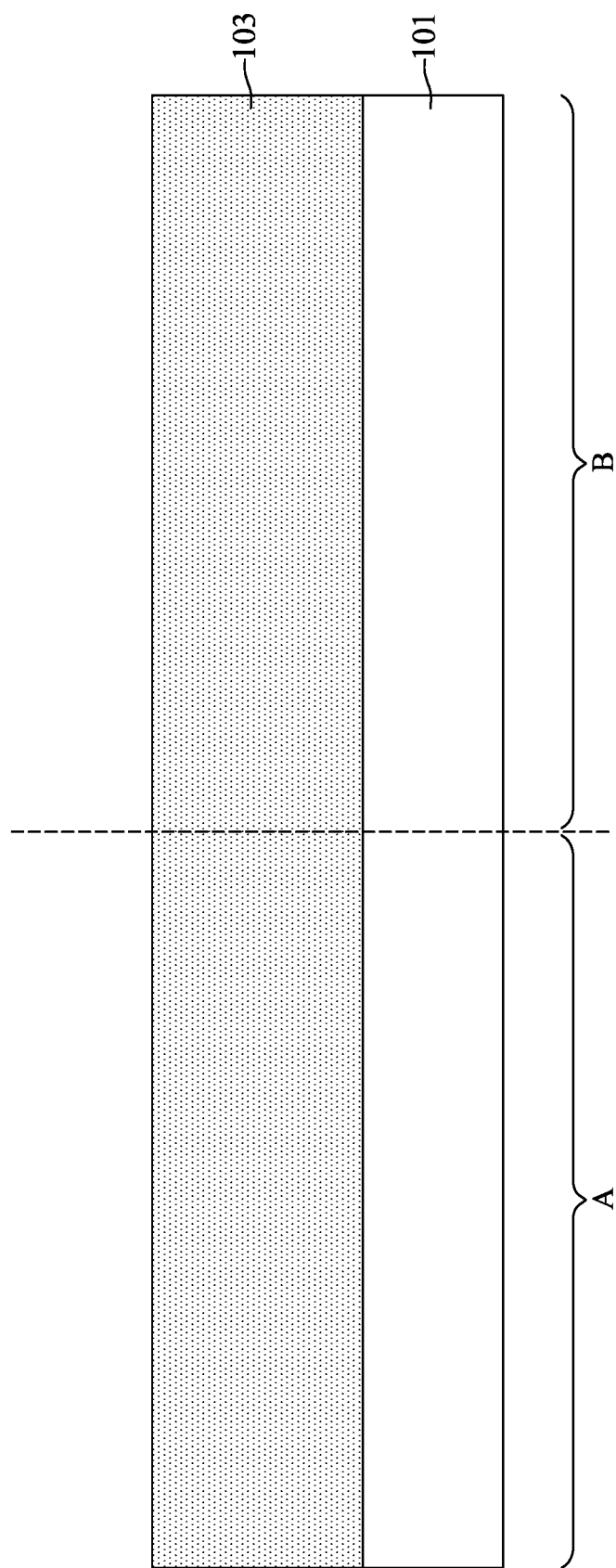
FIG. 9 is a cross-sectional view illustrating an intermediate stage of forming a doped oxide layer during the formation of the semiconductor device, in accordance with some other embodiments.

A doped oxide layer 103 is formed over the pattern-dense region A and the pattern-loose region B of the semiconductor substrate 101, as shown in FIG. 9 in accordance with some embodiments. The respective step is illustrated as the step S21 in the method 20 shown in FIG. 4. In some embodiments, the doped oxide layer 103 is made of silicon oxide, and P-type dopants, such as boron (B), gallium (Ga), or indium (In), or N-type dopants, such as phosphorous (P) or arsenic (As), can be implanted therein. In some embodiments, the doped oxide layer 103 is formed by a deposition process and is doped in-situ during the deposition process. In some other embodiments, the doped oxide layer 103 is formed by a deposition process and a subsequent ion implantation process.

Figure 10:
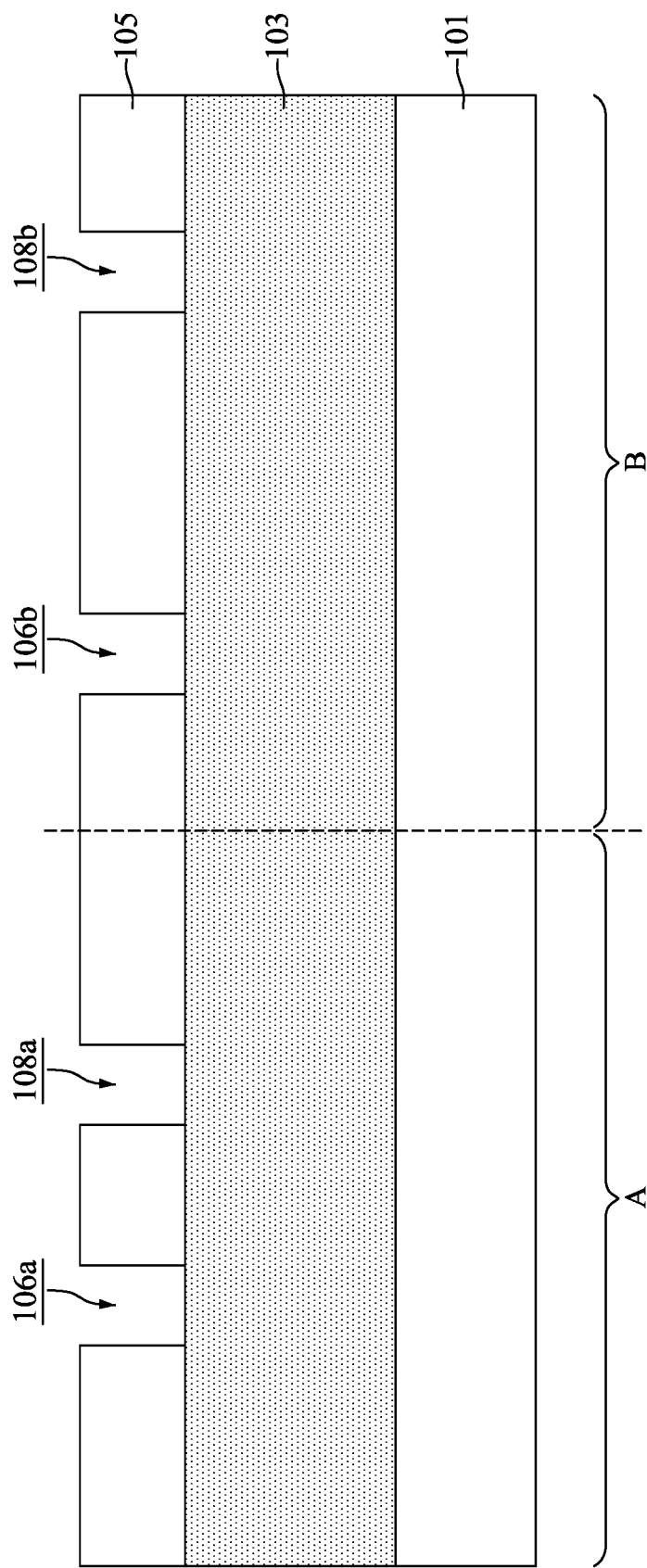
FIG. 10 is a cross-sectional view illustrating an intermediate stage of forming a patterned mask during the formation of the semiconductor device structure, in accordance with some embodiments.

Next, a patterned mask 105 is formed over the doped oxide layer 103, as shown in FIG. 10 in accordance with some embodiments. In some embodiments, the patterned mask 105 has openings 106a, 106b, 108a, and 108b, and portions of the doped oxide layer 103 are exposed by the openings 106a, 106b, 108a, and 108b of the patterned mask 105.

The patterned mask 105 may be formed by a deposition process and a patterning process. The deposition process for forming the patterned mask 105 may be a CVD process, a high-density plasma CVD (HDPCVD) process, a spin-coating process, or another applicable process. The patterning process for forming the patterned mask 105 may include a photolithography process and an etching process. The photolithography process may include photoresist coating (e.g., spin-coating), soft baking, mask aligning, exposure, post-exposure baking, developing the photoresist, rinsing and drying (e.g., hard baking). The etching process may include a dry etching process or a wet etching process.

Figure 11:
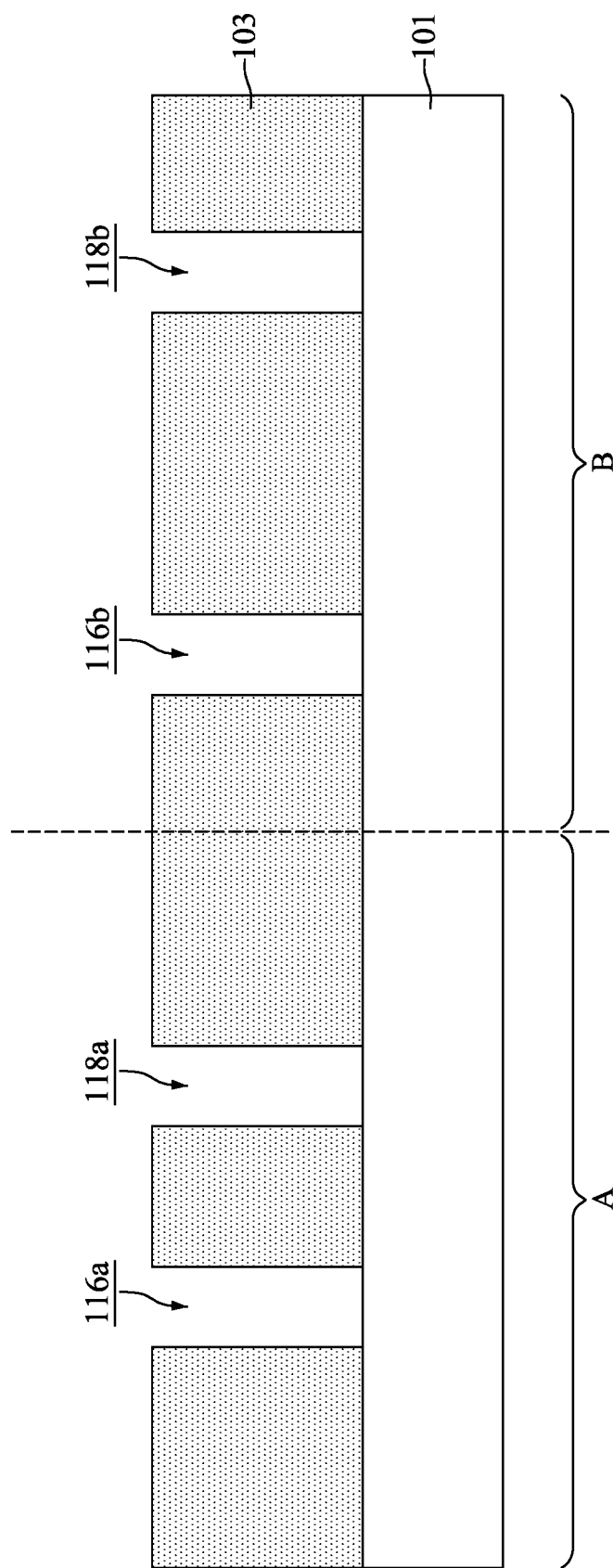
FIG. 11 is a cross-sectional view illustrating an intermediate stage of forming openings in the doped oxide layer during the formation of the semiconductor device, in accordance with some embodiments.

Subsequently, an etching process is performed on the doped oxide layer 103 using the patterned mask 105 as a mask, as shown in FIG. 11 in accordance with some embodiments. After the etching process, openings 116a, 116b, 118a, and 118b are formed in the doped oxide layer 103. In some embodiments, portions of the semiconductor substrate 101 are exposed by the openings 116a, 116b, 118a, and 118b of the doped oxide layer 103. In particular, the openings 116a and 118a are located on the pattern-dense region A of the semiconductor substrate 101, and the openings 116b and 118b are located on the pattern-loose region B of the semiconductor substrate 101, in accordance with some embodiments. After the openings 116a, 116b, 118a, and 118b are formed, the patterned mask 105 may be removed.

Figure 12:
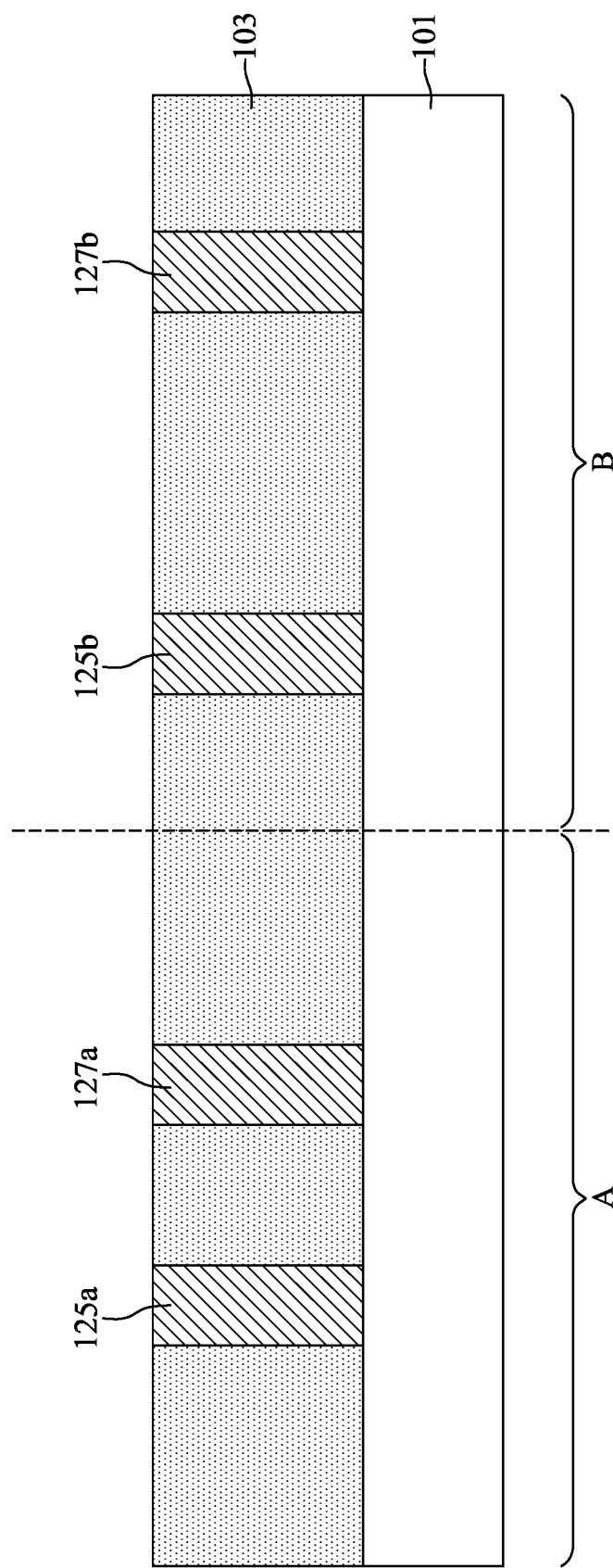
FIG. 12 is a cross-sectional view illustrating an intermediate stage of forming metal plugs in the doped oxide layer during the formation of the semiconductor device, in accordance with some embodiments.

Then, metal plugs 125a, 125b, 127a, and 127b are formed in the openings 116a, 116b, 118a, and 118b, as shown in FIG. 12 in accordance with some embodiments. The respective step is illustrated as the step S23 in the method 20 shown in FIG. 4. In some embodiments, the metal plugs 125a and 127a are formed over the pattern-dense region A of the semiconductor substrate 101, and the metal plugs 125b and 127b are formed over the pattern-loose region B of the semiconductor substrate 101.

Some materials used to form the metal plugs 125a, 125b, 127a, and 127b of FIG. 12 are similar to, or the same as, those used to form the metal plugs 125a, 125b, 127a, and 127b of FIG. 6, and details thereof are not repeated herein. In addition, the formation of the metal plugs 125a, 125b, 127a, and 127b of FIG. 12 may include depositing a conductive material (not shown) in the openings 116a, 116b, 118a, and 118b and over the doped oxide layer 103, and performing a planarization process to remove the excess portions of the conductive material, such that the doped oxide layer 103 is exposed. In some embodiments, the patterned mask 105 (see FIG. 10) is not removed after the openings 116a, 116b, 118a, and 118b are formed, and the conductive layer is deposited in the openings 116a, 116b, 118a, and 118b and over the patterned mask 105. In these cases, the patterned mask 105 may be removed during the planarization process. The planarization process may be a chemical mechanical polishing (CMP) process.

Figure 13:
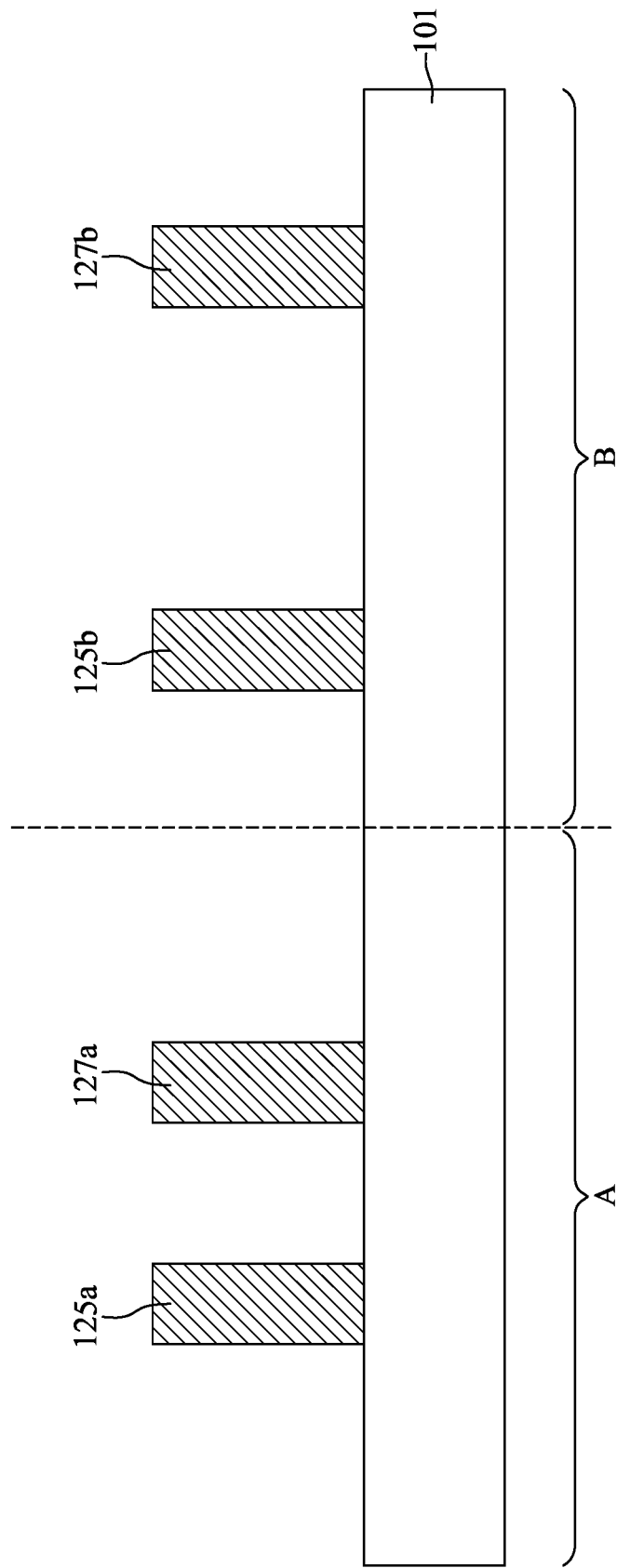
FIG. 13 is a cross-sectional view illustrating an intermediate stage of removing the doped oxide layer during the formation of the semiconductor device, in accordance with some embodiments.

After the metal plugs 125a, 125b, 127a, and 127b are formed, the doped oxide layer 103 is removed, as shown in FIG. 13 in accordance with some embodiments. The respective step is illustrated as the step S25 in the method 20 shown in FIG. 4. In some embodiments, the doped oxide layer 103 is removed by an ashing process or stripping process. In some other embodiments, an etching process is used to remove the doped oxide layer 103. The etching process may include a wet etching process, a dry etching process, or a combination thereof.

Figure 14:
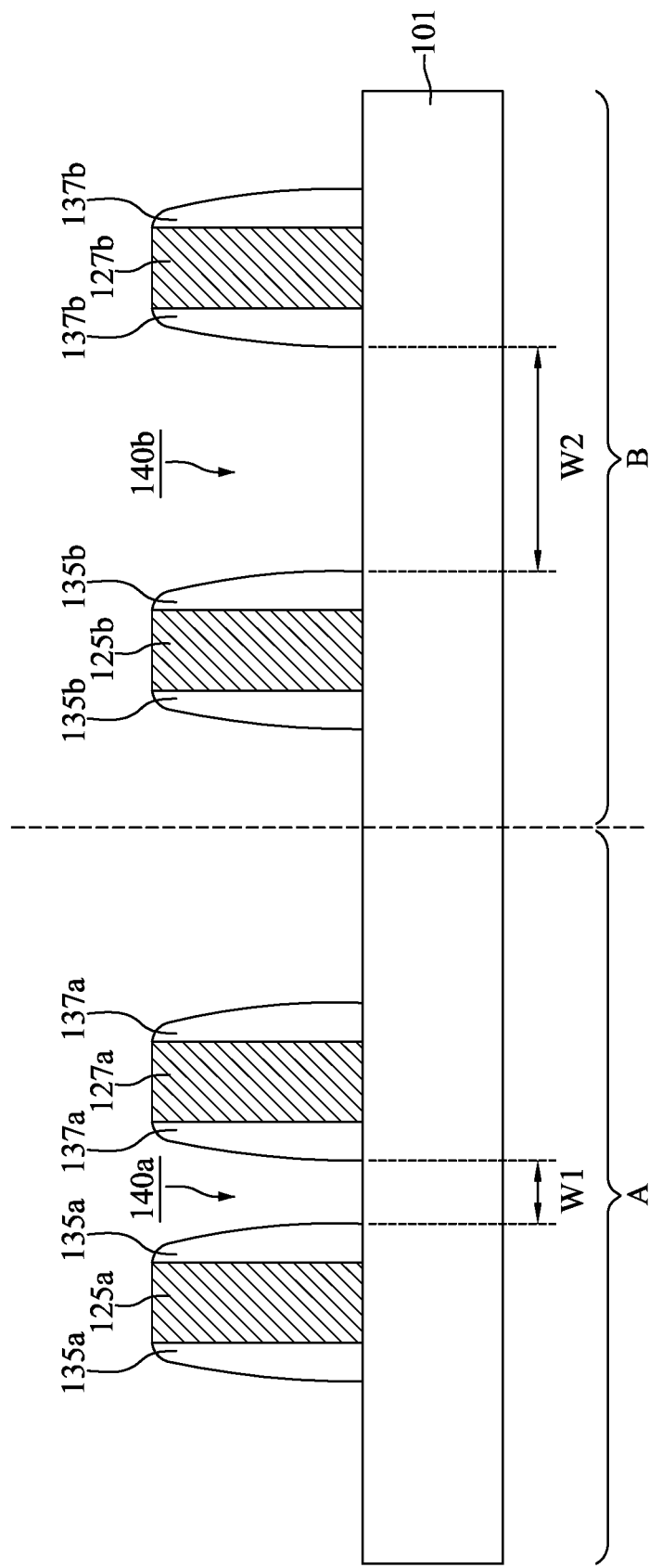
FIG. 14 is a cross-sectional view illustrating an intermediate stage of forming spacers during the formation of the semiconductor device, in accordance with some embodiments.

Next, as shown in FIG. 14, the spacers 135a, 135b, 137a, and 137b are formed surrounding the metal plugs 125a, 125b, 127a, and 127b, in accordance with some embodiments. The respective step is illustrated as the step S27 in the method 20 shown in FIG. 4. Some materials and processes used to form the spacers 135a, 135b, 137a, and 137b of FIG. 14 are similar to, or the same as, those used to form the spacers 135a, 135b, 137a, and 137b of FIG. 8, and details thereof are not repeated herein.

After the spacers 135a, 135b, 137a, and 137b are formed, opening 140a between the spacers 135a and 137a and opening 140b between the spacers 135b and 137b are obtained. It should be noted that the width W1 of the opening 140a in the pattern-dense region A is less than the width W2 of the opening 140b in the pattern-loose region B, in accordance with some embodiments.

Figure 15:
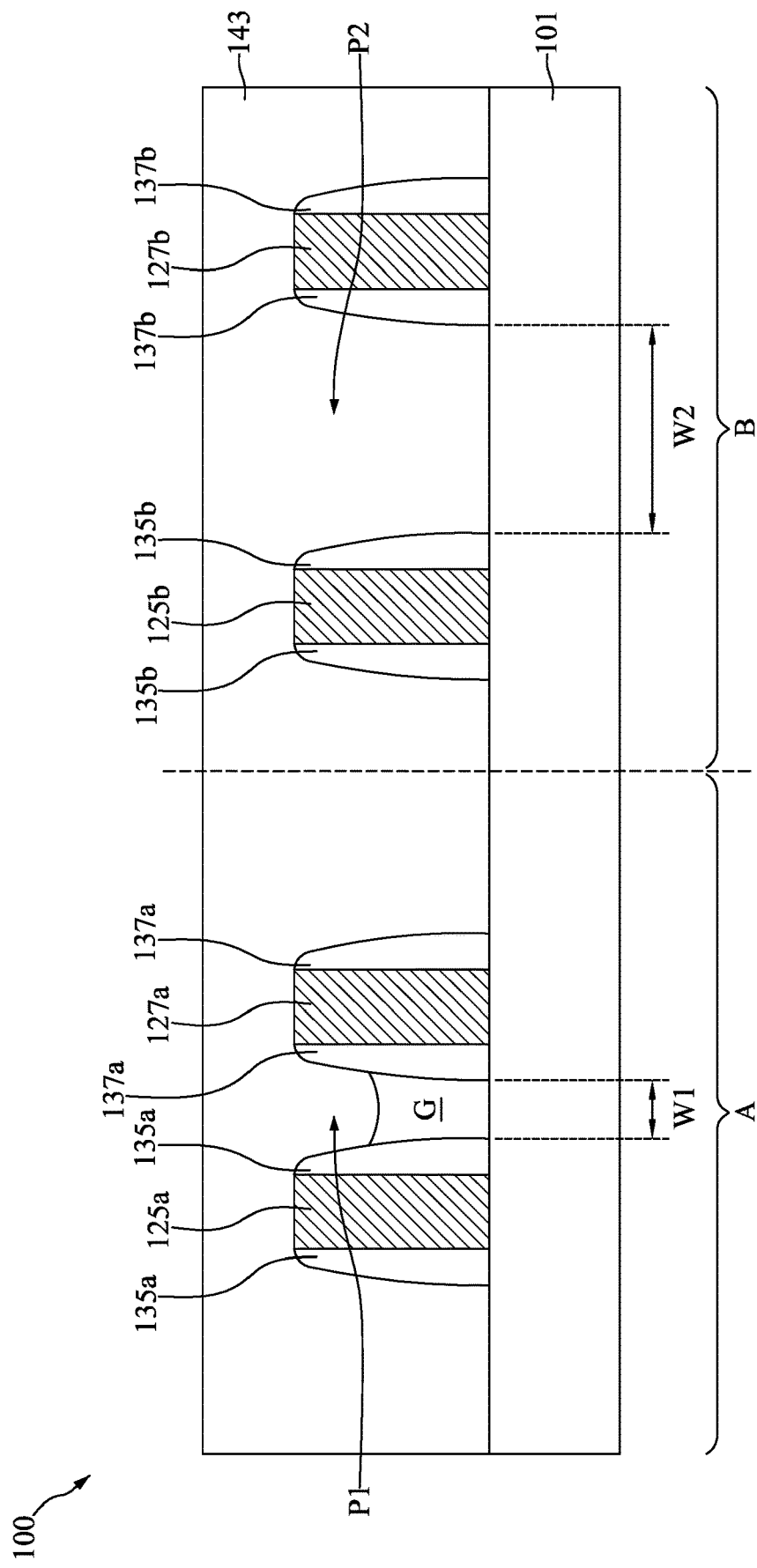
FIG. 15 is a cross-sectional view illustrating an intermediate stage of forming a dielectric layer during the formation of the semiconductor device, in accordance with some embodiments.

After the spacers 135a, 135b, 137a, and 137b are formed, the boron nitride layer 143 is deposited over the structure of FIG. 14, such that the air gap G is formed in the opening 140a in the pattern-dense region A, as shown in FIG. 15 in accordance with some embodiments. The respective step is illustrated as the step S29-1 in the method 20 shown in FIG. 4. Some materials and processes used to form the boron nitride layer 143 of FIG. 15 are similar to, or the same as, those used to form the boron nitride layer 143 of FIG. 2, and details thereof are not repeated herein.

As mentioned above, the width W2 of the opening 140b is greater than the width W1 of the opening 140a (see FIG. 14). Therefore, the opening 140b is entirely filled by the boron nitride layer 143 while the opening 140a is only partially filled by the boron nitride layer 143 due to the loading effect. As a result, the air gap G is sealed by the first portion P1 of the boron nitride layer 143, and the second portion P2 of the boron nitride layer 143 is in direct contact with the semiconductor substrate 101.

Figure 16:
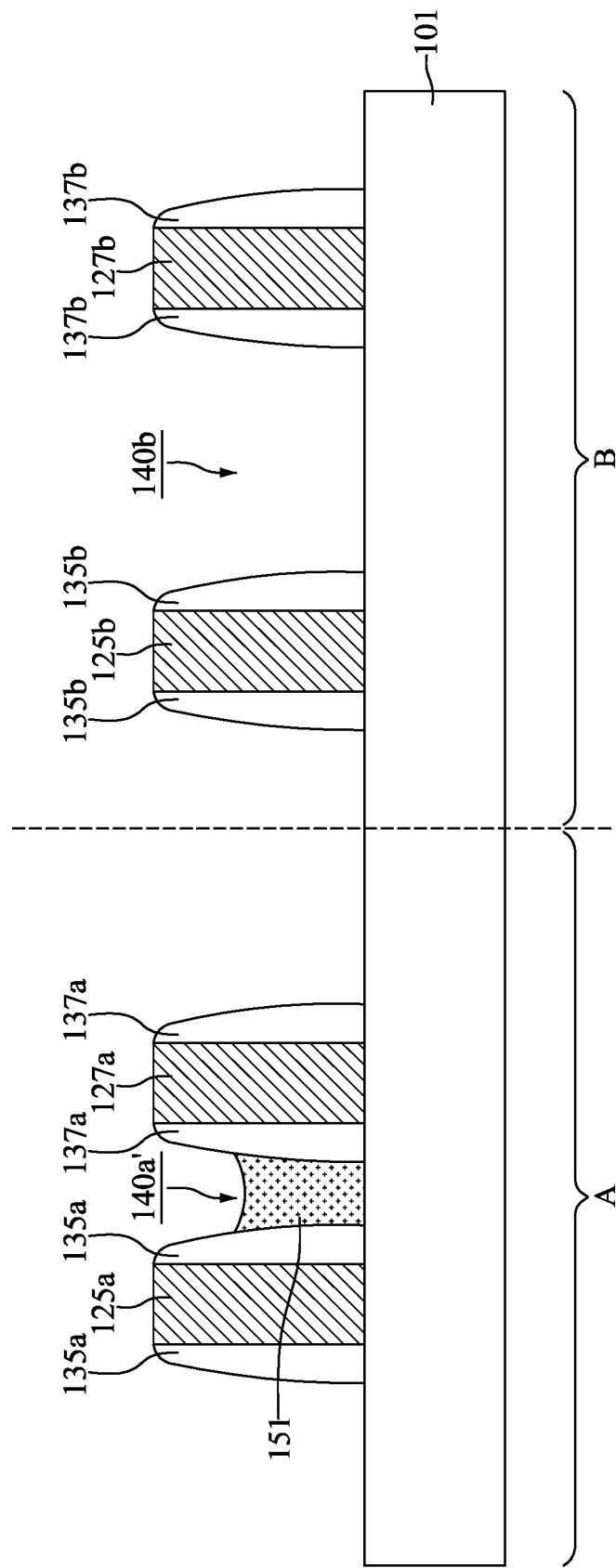
FIG. 16 is a cross-sectional view illustrating an intermediate stage of forming an energy removable layer during the formation of the semiconductor device, in accordance with some embodiments.
Figure 17:
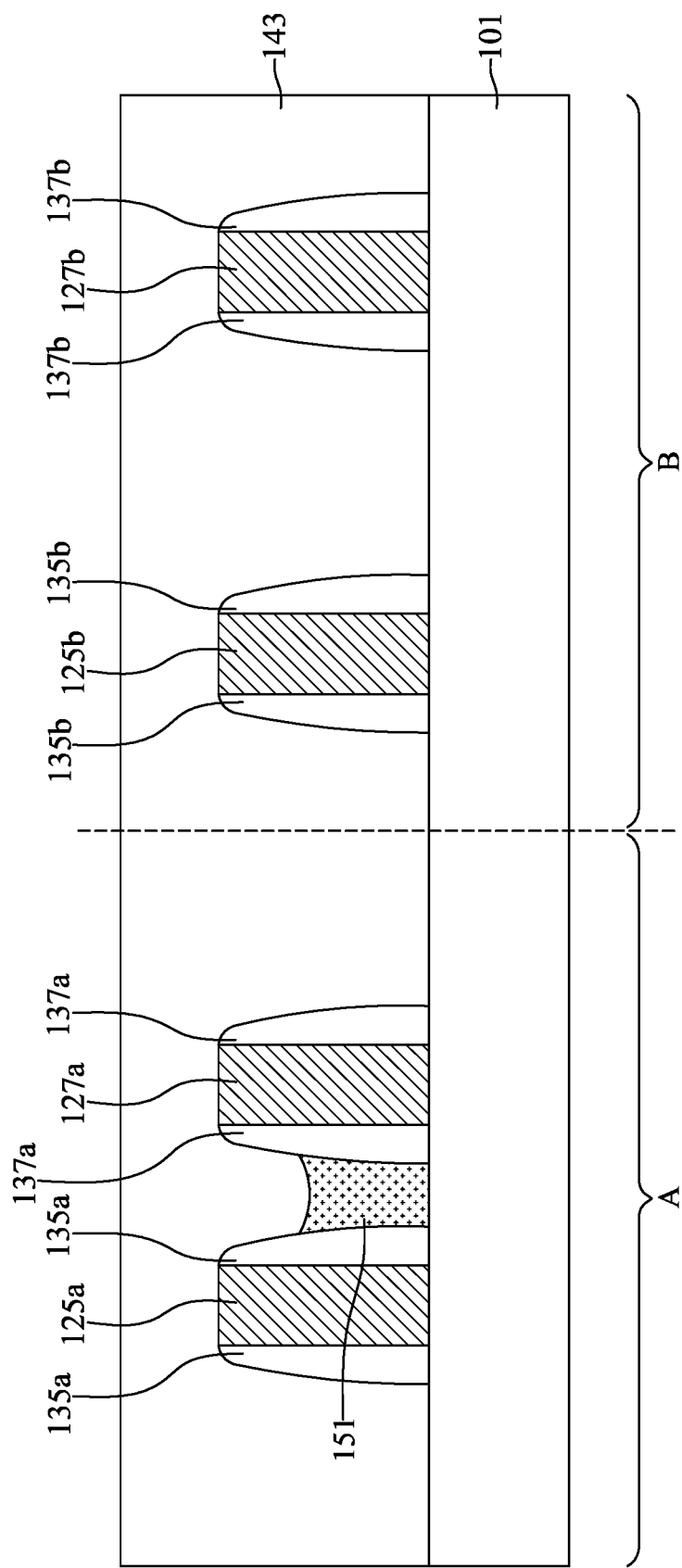
FIG. 17 is a cross-sectional view illustrating an intermediate stage of forming a dielectric layer during the formation of the semiconductor device, in accordance with some embodiments.
Figure 18:
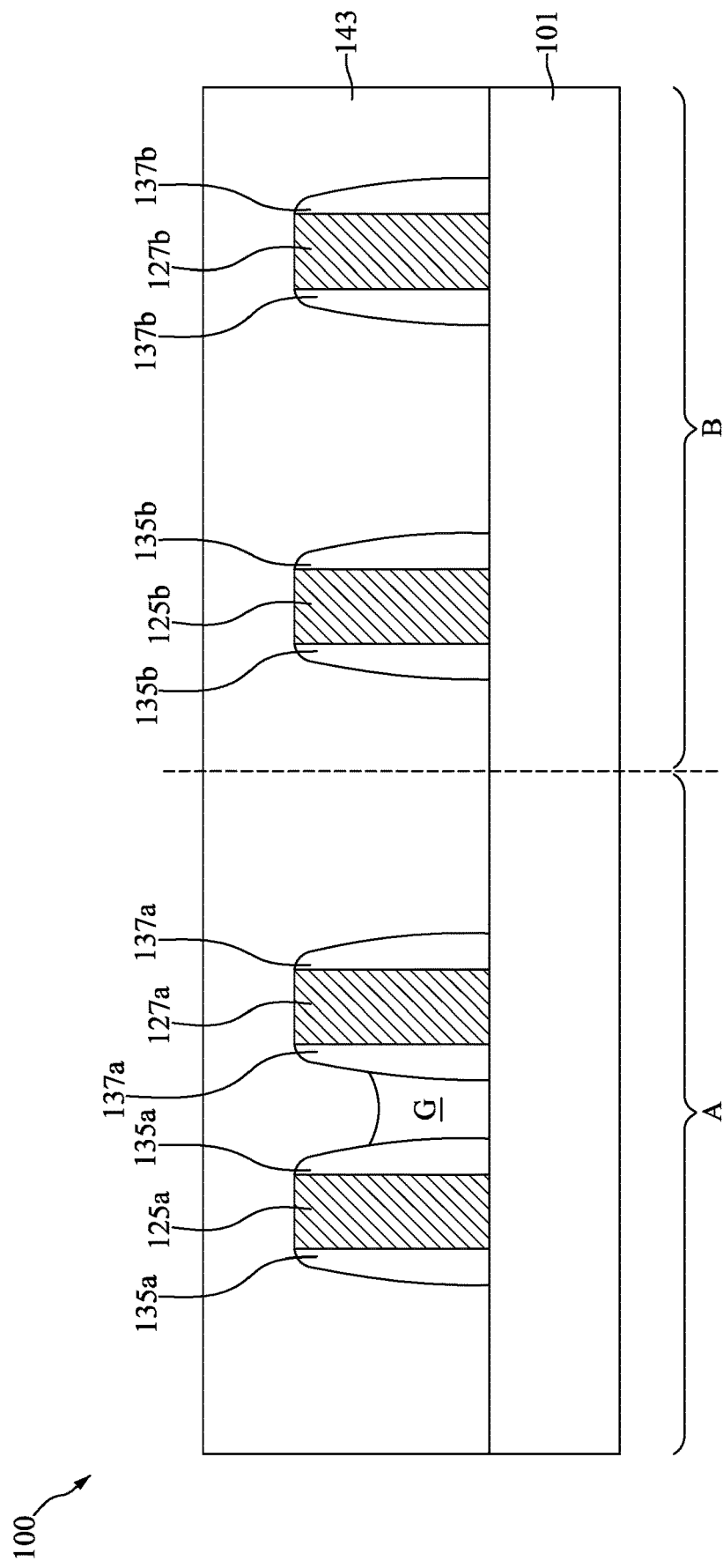
FIG. 18 is a cross-sectional view illustrating an intermediate stage of removing the energy removable layer during the formation of the semiconductor device, in accordance with some embodiments.

FIGS. 16 to 18 are cross-sectional views illustrating intermediate stages in the formation of the semiconductor device 100, in accordance with some embodiments. The forming method shown in FIGS. 16 to 18 is different from the forming method shown in FIGS. 1, 2, and 5 to 8 and the forming method shown in FIGS. 9 to 15.

After the spacers 135a, 135b, 137a, and 137b are formed, Continuing with FIG. 8 or 14, an energy removable layer 151 is selectively deposited between the spacers 135a and 137a in the pattern-dense region A, as shown in FIG. 16 in accordance with some embodiments. The respective step is illustrated as the step S15-2 in the method 10 shown in FIG. 3 and the step S29-2 in the method 20 shown in FIG. 4. It should be noted that the energy removable layer 151 is formed by performing a deposition process that selectively deposits the energy removable layer 151 between the spacers 135a and 137a in the pattern-dense region A without depositing the energy removable layer 151 between the spacers 135b and 137b in the pattern-loose region B, in accordance with some embodiments.

In some embodiments, the materials of the energy removable layer 151 include a thermal decomposable material. In some other embodiments, the materials of the energy removable layer 151 include a photonic decomposable material, an e-beam decomposable material, or another applicable energy decomposable material. Specifically, in some embodiments, the materials of the energy removable layer 151 include a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the energy removable layer 151 in the subsequent processes. In addition, the deposition process for forming the dielectric layer 151 may include a CVD process, a PVD process, an ALD process, a spin-coating process, or another applicable process. After the energy removable layer 151 is formed, a reduced opening 140a' may be obtained over the energy removable layer 151.

Then, the boron nitride layer 143 is formed covering the structure of FIG. 16, as shown in FIG. 17 in accordance with some embodiments. The respective step is illustrated as the step S17 in the method 10 shown in FIG. 3 and the step S31 in the method 20 shown in FIG. 4. Some materials and processes used to form the boron nitride layer 143 of FIG. 17 are similar to, or the same as, those used to form the boron nitride layer 143 of FIG. 2, and details thereof are not repeated herein. It should be noted that the structure has no air gaps in this stage.

After the boron nitride layer 143 is deposited, a heat treatment process is performed, as shown in FIG. 18 in accordance with some embodiments. In some embodiments, during the heat treatment process, the energy removable layer 151 is removed, such that the air gap G is formed between the spacers 135a and 137a in the pattern-dense region A. The respective step is illustrated as the step S19 in the method 10 shown in FIG. 3 and the step S33 in the method 20 shown in FIG. 4.

More specifically, the heat treatment process is used to remove the decomposable porogen materials of the energy removable layer 151 to generate pores, and the pores are filled by air after the decomposable porogen materials are removed, such that the air gap G is obtained, in accordance with some embodiments. In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the energy removable layer 151, such that the air gap G is obtained.

Figure 19:
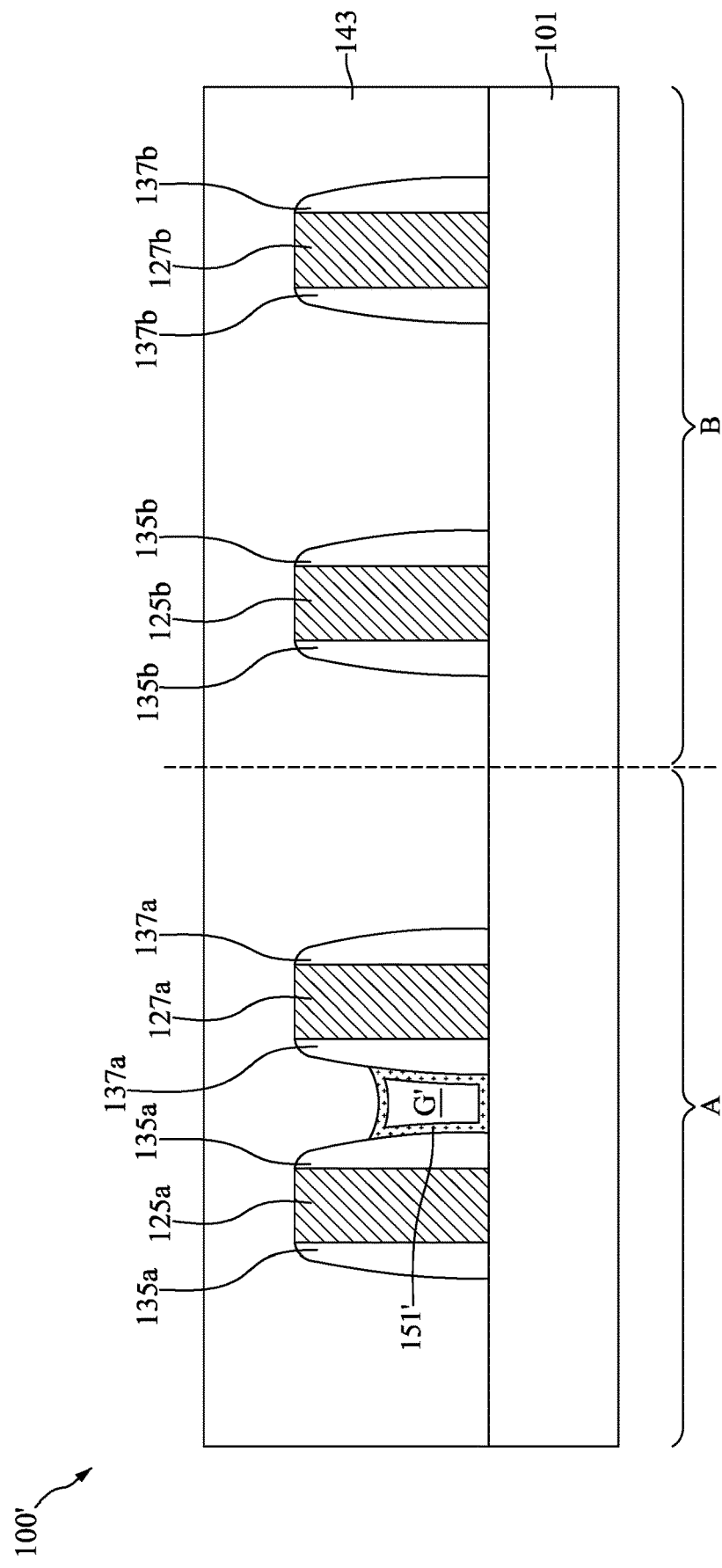
FIG. 19 is a cross-sectional view illustrating an intermediate stage of forming an energy removable structure during the formation of a modified semiconductor device, in accordance with some embodiments.

FIG. 19 is a cross-sectional view illustrating an intermediate stage of forming an energy removable structure 151' during the formation of a modified semiconductor device 100', in accordance with some embodiments.

Continuing with FIG. 17, a heat treatment process is performed to remove a portion of the energy removable layer 151, as shown in FIG. 19 in accordance with some embodiments. In some embodiments, during the heat treatment process, the energy removable layer 151 is transformed into an energy removable structure 151', such that the air gap G is enclosed by the energy removable structure 151'. The respective step is illustrated as the step S19 in the method 10 shown in FIG. 3 and the step S33 in the method 20 shown in FIG. 4.

More specifically, in some embodiments, the heat treatment process is used to remove the decomposable porogen materials of the energy removable layer 151 to generate pores, and the base materials of the energy removable layer 151 are accumulated at the edges of the energy removable layer 151. The pores are filled by air after the decomposable porogen materials are removed, such that the air gap G is obtained inside the remaining portions of the energy removable layer 151 (i.e., the energy removable structure 151'), in accordance with some embodiments. In some other embodiments, the air gap G is not fully surrounded by the energy removable structure 151' due to gravity, and a portion of the energy removable structure 151' is between the air gap G and the semiconductor substrate 101. After the energy removable structure 151' is formed, the modified semiconductor device 100' is obtained.

Figure 20:
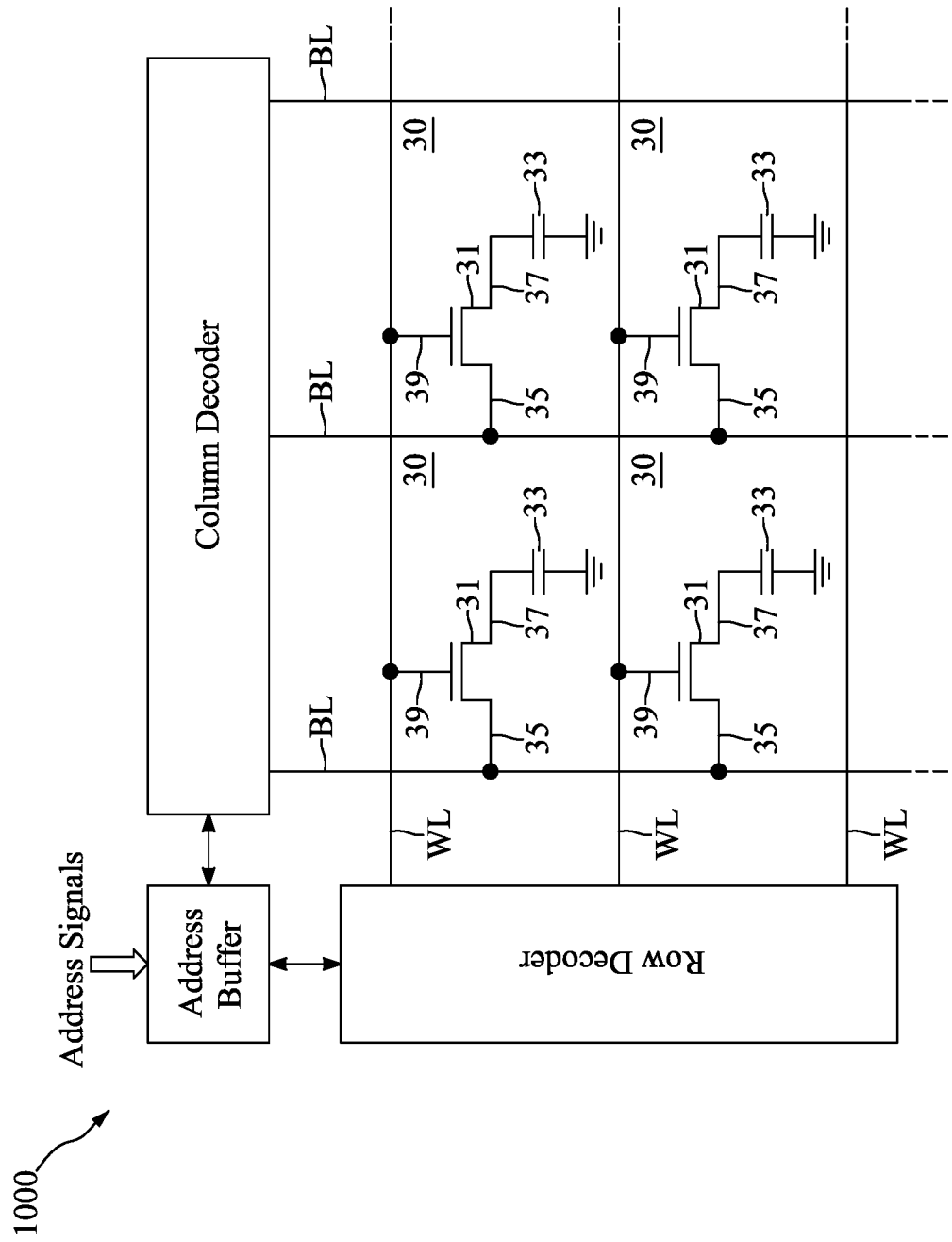
FIG. 20 is a partial schematic illustration of an exemplary integrated circuit, including an array of memory cells in accordance with some embodiments.

FIG. 20 is a partial schematic illustration of an exemplary integrated circuit, such as a memory device 1000, including an array of memory cells 30 in accordance with some embodiments. In some embodiments, the memory device 1000 includes a dynamic random access memory (DRAM). In some embodiments, the memory device 1000 includes a number of memory cells 30 arranged in a grid pattern and including a number of rows and columns. The number of memory cells 30 may vary depending on system requirements and fabrication technology.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage at the gate 39 via the word line WL, a voltage potential may be created across the FET 30 such that the electrical charge can flow from the drain 35 to the capacitor 33. Therefore, the electrical charge stored in the capacitor 33 may be interpreted as a binary data value in the memory cell 30. For example, a positive charge above a threshold voltage stored in the capacitor 33 may be interpreted as binary "1." If the charge in the capacitor 33 is below the threshold value, a binary value of "0" is said to be stored in the memory cell 30.

The bit lines BL are configured to read and write data to and from the memory cells 30. The word lines WL are configured to activate the field effect transistors (FET) 31 to access a particular row of the memory cells 30. Accordingly, the memory device 1000 also includes a periphery region which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Referring back to FIGS. 2 and 19, the air gap G is formed in the pattern-dense region A of the semiconductor device 100 or 100', while no air gap is formed in the pattern-loose region B of the semiconductor device 100 or 100'. The pattern-dense region A may be any of the regions of the memory cells 30 in the memory device 1000, and the pattern-loose region B may be any of the regions of the address buffer, the row decoder, or the column decoder in the memory device 1000.

Embodiments of the semiconductor devices 100 and 100' are provided in the disclosure. The semiconductor devices 100 and 100' include a plurality of metal plugs 125a, 125b, 127a, 127b over the pattern-dense region A and the pattern-loose region B of the semiconductor substrate 101, spacers 135a, 135b, 137a, 137b surrounding the metal plugs 125a, 125b, 127a, 127b, respectively, and the boron nitride layer 143 covering the metal plugs 125a, 125b, 127a, 127b and the spacers 135a, 135b, 137a, 137b. Particularly, the boron nitride layer 143 has a first portion P1 between the spacers 135a and 137a in the pattern-dense region A and a second portion P2 between the spacers 135b and 137b in the pattern-loose region B, the first portion P1 of the boron nitride layer 143 is separated from the semiconductor substrate 101 by an air gap G while the second portion P2 of the dielectric layer is in direct contact with the semiconductor substrate 101. Therefore, the parasitic capacitance between the metal plugs 125a and 127a over the pattern-dense region A may be reduced. As a result, the overall device performance may be improved (i.e., the decreased power consumption and resistive-capacitive (RC) delay).

In one embodiment of the present disclosure, a semiconductor device is provided. The semiconductor device includes a first metal plug and a second metal plug disposed over a pattern-dense region of a semiconductor substrate. The semiconductor device also includes a third metal plug and a fourth metal plug disposed over a pattern-loose region of the semiconductor substrate. The semiconductor device further includes a dielectric layer disposed over the pattern-dense region and the pattern-loose region of the semiconductor substrate. A first portion of the dielectric layer between the first metal plug and the second metal plug is separated from the semiconductor substrate by an air gap, and a second portion of the dielectric layer between the third metal plug and the fourth metal plug is in direct contact with the semiconductor substrate.

In another embodiment of the present disclosure, a semiconductor device is provided. The semiconductor device includes a first metal plug and a second metal plug disposed over a pattern-dense region of a semiconductor substrate. The first metal plug and the second metal plug have an air gap therebetween. The semiconductor device also includes a third metal plug and a fourth metal plug disposed over a pattern-loose region of the semiconductor substrate. A distance between the first metal plug and the second metal plug is less than a distance between the third metal plug and the fourth metal plug. The semiconductor device further includes a dielectric layer covering the first metal plug, the second metal plug, the third metal plug, and the fourth metal plug. The dielectric layer has a first portion between the first metal plug and the second metal plug and a second portion between the third metal plug and the fourth metal plug, and a height of the second portion is greater than a height of the first portion.

In yet another embodiment of the present disclosure, a method for preparing a semiconductor device is provided. The method includes forming a first metal plug, a second metal plug, a third metal plug, and a fourth metal plug over a semiconductor substrate, wherein the first metal plug and the second metal plug are over a pattern-dense region of the semiconductor substrate, and the third metal plug and the fourth metal plug are over a pattern-loose region of the semiconductor substrate. The method also includes depositing a dielectric layer over the first metal plug, the second metal plug, the third metal plug, and the fourth metal plug. A first portion of the dielectric layer extends between the first metal plug and the second metal plug such that the first portion of the dielectric layer and the semiconductor substrate are separated by an air gap while a second portion of the dielectric layer extends between the third metal plug and the fourth metal plug such that the second portion of the dielectric layer is in direct contact with the semiconductor substrate.

The embodiments of the present disclosure have some advantageous features. By forming an air gap between the adjacent metal plugs in the pattern-dense region, the parasitic capacitance between the metal plugs in the pattern-dense region may be reduced. This significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a first conductive feature, a second conductive feature, a third conductive feature, and a fourth conductive feature over a semiconductor substrate, wherein the first conductive feature and the second conductive feature are formed over a pattern-dense region of the semiconductor substrate, and the third conductive feature and the fourth conductive feature are formed over a pattern-loose region of the semiconductor substrate;
    depositing a boron nitride layer over the first conductive feature, the second conductive feature, the third conductive feature, and the fourth conductive feature, wherein a first portion of the boron nitride layer extends between the first conductive feature and the second conductive feature such that the first portion of the boron nitride layer and the semiconductor substrate are separated by an air gap while a second portion of the boron nitride layer extends between the third conductive feature and the fourth conductive feature such that the second portion of the boron nitride layer is in direct contact with the semiconductor substrate;
    forming a first spacer on a sidewall of the first conductive feature, a second spacer on a sidewall of the second conductive feature, a third spacer on a sidewall of the third conductive feature, and a fourth spacer on a sidewall of the fourth conductive feature before the boron nitride layer is deposited; and
    before the boron nitride layer is deposited, performing a deposition process to selectively form an energy removable layer between the first spacer and the second spacer in the pattern-dense region without depositing the energy removable layer between the third spacer and the fourth spacer in the pattern-loose region.

2. The method for preparing a semiconductor device of claim 1, wherein a bottommost width of the second portion of the boron nitride layer is greater than a bottommost width of the first portion of the boron nitride layer.

3. The method for preparing a semiconductor device of claim 1, wherein the boron nitride layer is formed to cover the energy removable layer, and the method further comprises:

performing a heat treatment process to remove the energy removable layer, such that the air gap is enclosed by the first spacer, the second spacer, the first portion of the boron nitride layer, and the semiconductor substrate.

4. The method for preparing a semiconductor device of claim 1, wherein the boron nitride layer is formed to cover the energy removable layer, and the method further comprises:

performing a heat treatment process to transform the energy removable layer into an energy removable structure, wherein the air gap is enclosed by the energy removable structure, and the energy removable structure is denser than the energy removable layer.

5. The method for preparing a semiconductor device of claim 1, wherein the first conductive feature is separated from the second conductive feature by a first distance, the third conductive feature is separated from the fourth conductive feature by a second distance, and the second distance is greater than the first distance.

6. The method for preparing a semiconductor device of claim 1, wherein the first conductive feature, the second conductive feature, the third conductive feature, and the fourth conductive feature are covered by the boron nitride layer, and a top surface of the first conductive feature is higher than a bottom surface of the first portion of the boron nitride layer.

7. A method for preparing a semiconductor device, comprising:

forming a first conductive feature, a second conductive feature, a third conductive feature, and a fourth conductive feature over a semiconductor substrate, wherein the first conductive feature and the second conductive feature are formed over a pattern-dense region of the semiconductor substrate, and the third conductive feature and the fourth conductive feature are formed over a pattern-loose region of the semiconductor substrate; and depositing a boron nitride layer over the first conductive feature, the second conductive feature, the third conductive feature, and the fourth conductive feature, wherein a first portion of the boron nitride layer extends between the first conductive feature and the second conductive feature such that the first portion of the boron nitride layer and the semiconductor substrate are separated by an air gap while a second portion of the boron nitride layer extends between the third conductive feature and the fourth conductive feature such that the second portion of the boron nitride layer is in direct contact with the semiconductor substrate;

wherein the formation of the first conductive feature, the second conductive feature, the third conductive feature, and the fourth conductive feature comprises:

forming a doped oxide layer over the semiconductor substrate;

etching the doped oxide layer to form a plurality of openings exposing the semiconductor substrate;

forming the first conductive feature, the second conductive feature, the third conductive feature, and the fourth conductive feature in the openings; and removing the doped oxide layer before the boron nitride layer is deposited.

* * * * *